(12) United States Patent
Bosshart

(10) Patent No.: US 8,510,702 B2
(45) Date of Patent: Aug. 13, 2013

(54) INTERACTIVE ROUTING EDITOR WITH SYMBOLIC AND GEOMETRIC VIEWS FOR INTEGRATED CIRCUIT LAYOUT

(75) Inventor: Patrick W. Bosshart, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/297,086

(22) Filed: Nov. 15, 2011

(65) Prior Publication Data

US 2013/0125078 A1    May 16, 2013

(51) Int. Cl.
    *G06F 17/50*    (2006.01)
(52) U.S. Cl.
    USPC .......................... 716/128; 716/130; 716/138
(58) Field of Classification Search
    USPC ................................. 716/126, 128, 130, 138
    See application file for complete search history.

(56) References Cited

U.S. PATENT DOCUMENTS

| | | | | |
|---|---|---|---|---|
| 6,240,541 | B1* | 5/2001 | Yasuda et al. | 716/112 |
| 6,957,408 | B1* | 10/2005 | Teig et al. | 716/129 |
| 7,536,665 | B1* | 5/2009 | Horlick et al. | 716/126 |
| 7,793,249 | B1* | 9/2010 | Wadland et al. | 716/129 |
| 2003/0035417 | A1* | 2/2003 | Zirojevic et al. | 370/357 |
| 2009/0288056 | A1* | 11/2009 | Gitchev et al. | 716/12 |
| 2012/0023471 | A1* | 1/2012 | Fischer et al. | 716/115 |
| 2012/0023472 | A1* | 1/2012 | Fischer et al. | 716/122 |
| 2012/0272203 | A1* | 10/2012 | Hawk | 716/130 |

OTHER PUBLICATIONS

Adler et al.; "An Interactive Router for Analog IC Design"; 1998; University of Hanover, IEEE; pp. 414-420.*
Yang et al.; "An ILP based hierarchical global router approach"; Aug. 2006; University of Guelph; pp. 281-297.*
Kommuru et al., "ASIC Design Flow Tutorial Using Synopsys Tools", (San Francisco State University, 2009), available at http://userwww.sfsu.edu/~necrc/files/synopsys%20tutorials/ASIC%20Design%20Flow%20Tutorial.pdf, pp. 1-11, 92-102.

* cited by examiner

*Primary Examiner* — Suresh Memula
(74) *Attorney, Agent, or Firm* — John R. Pessetto; W. James Brady; Frederick J. Telecky, Jr.

(57) ABSTRACT

An automated system, and method of operating the same, for interactively routing interconnections in a layout of an integrated circuit. Interconnections among subchips in the integrated circuit, specified by a netlist, are displayed by the system by way of airlines. The system provides a symbolic view of the bus, showing a representative wire of the bus, such as that associated with the least-significant or most-significant bit position in the bus. The physical routing of the representative wire is interactively defined, using orthogonal wire segments in selected conductor levels. Bus properties, for example including bit pitch, wire pitch, LSB/MSB, and a direction of expansion, are associated with the routing data for each segment of the representative wire. The combination of the routing data and the bus property data enable building of the entire bus from the interactive routing of the representative wire in the symbolic view.

29 Claims, 13 Drawing Sheets

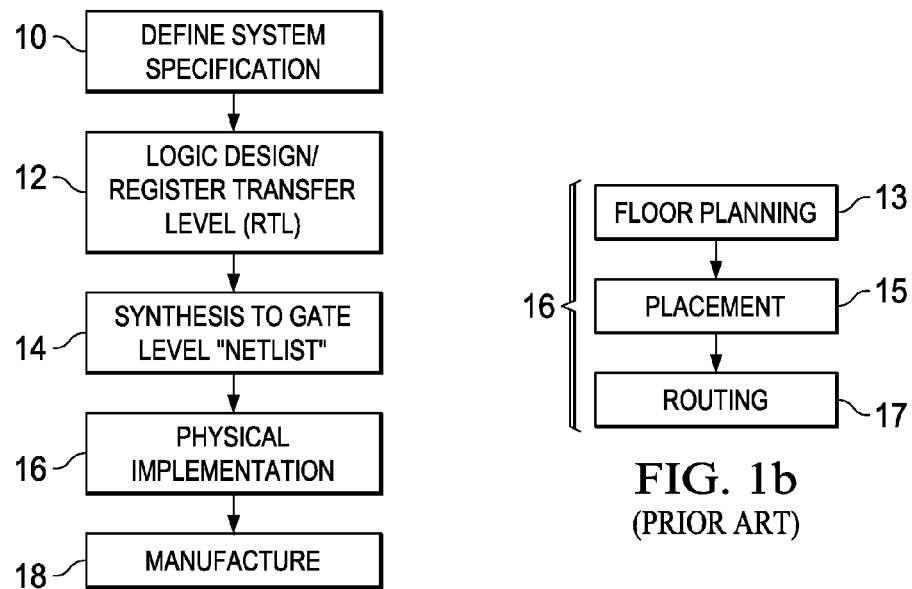
FIG. 1a
(PRIOR ART)
FIG. 1b
(PRIOR ART)
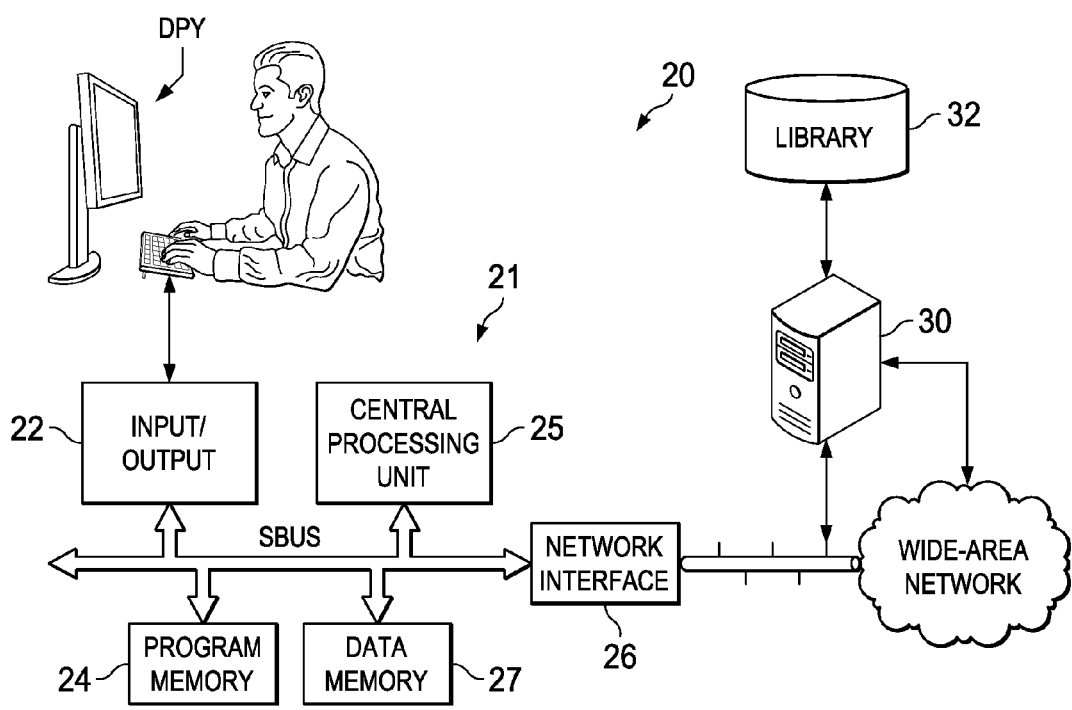
FIG. 2

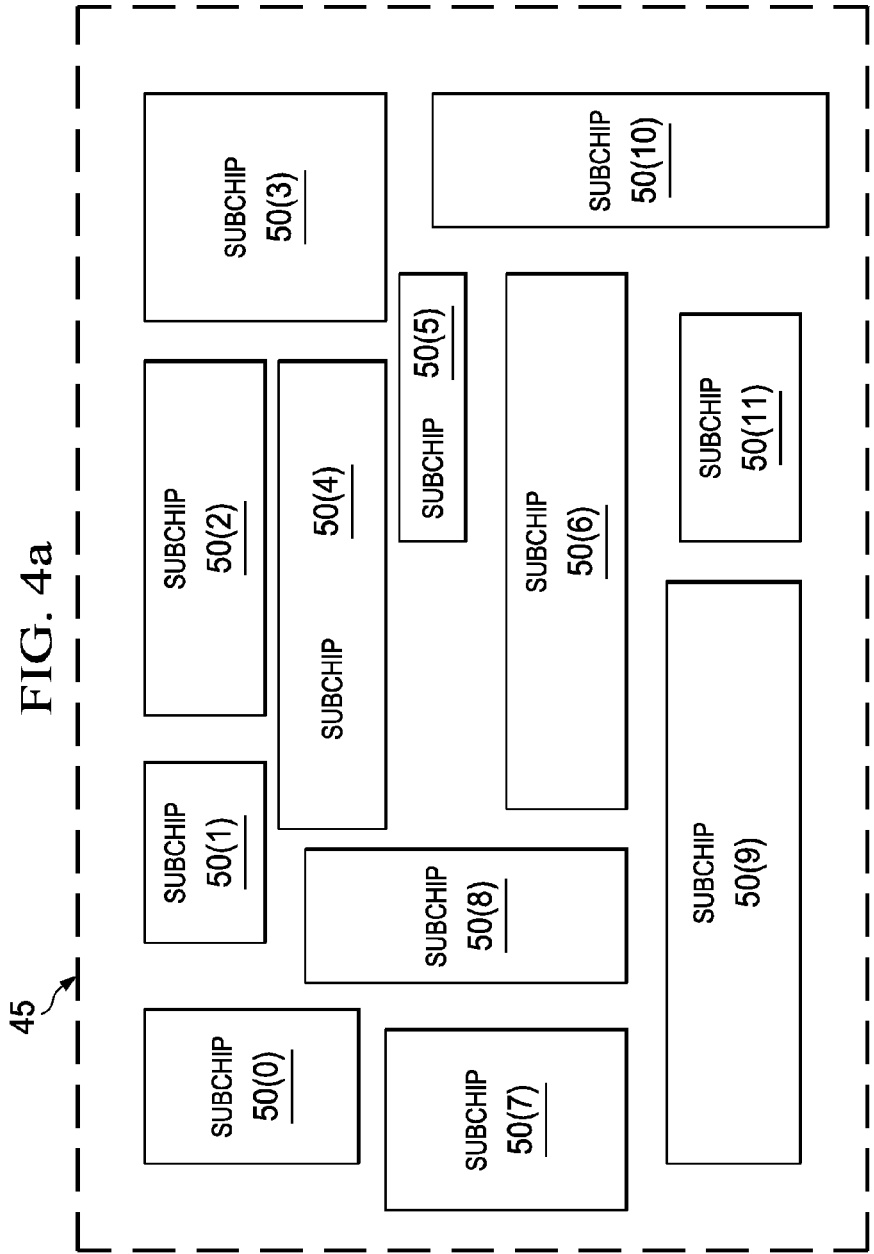

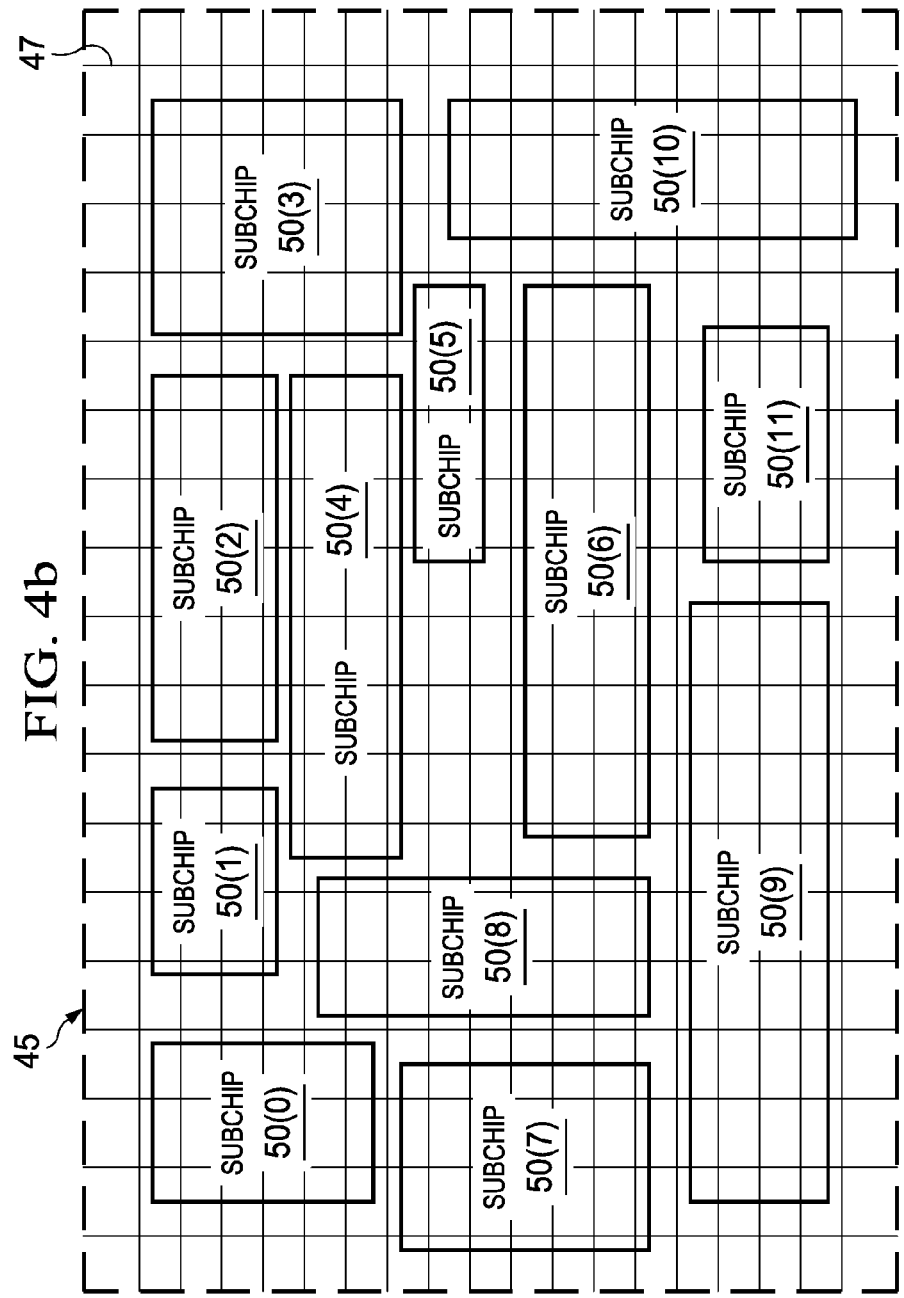

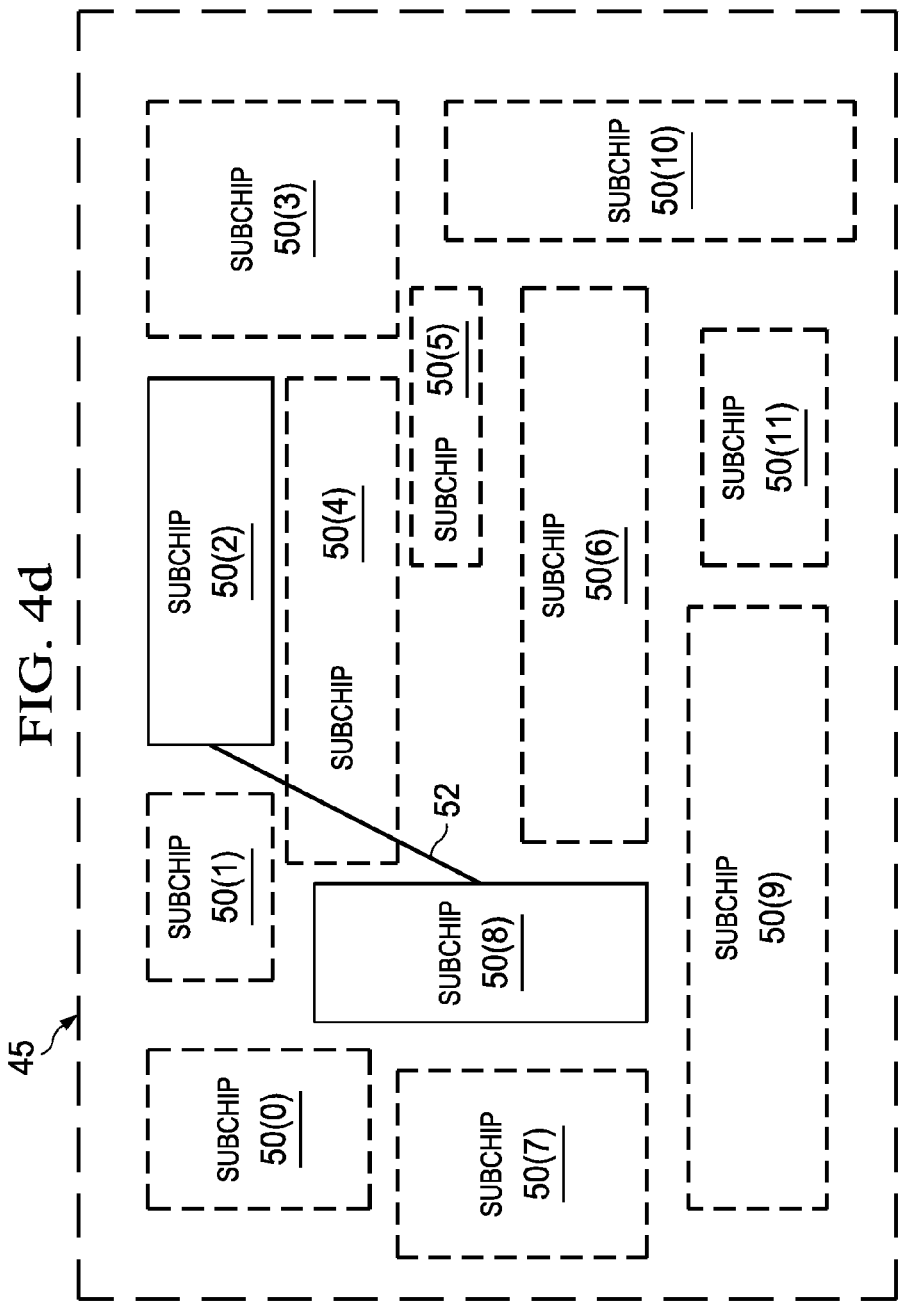

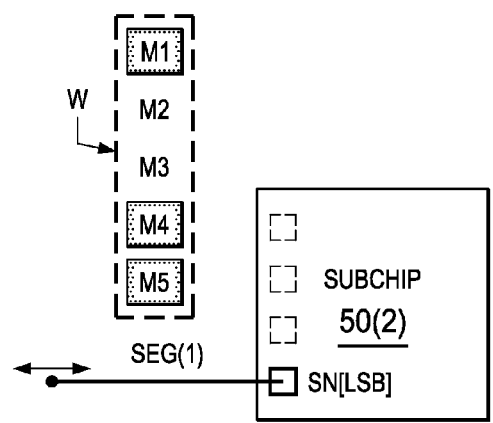
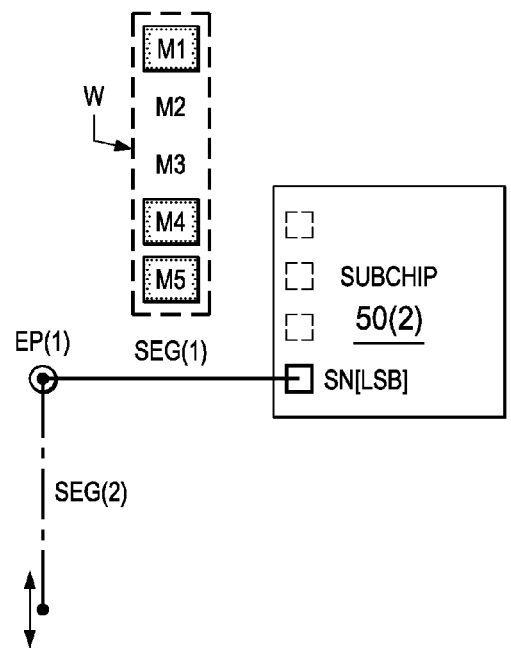
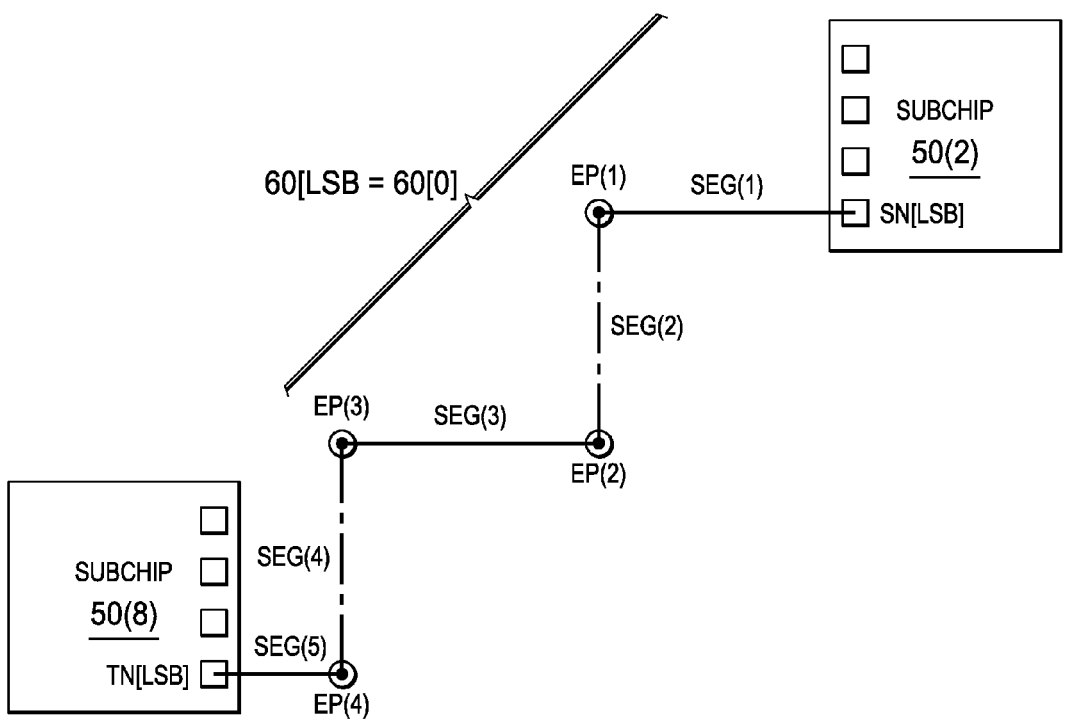
FIG. 7a
FIG. 7b
FIG. 7c

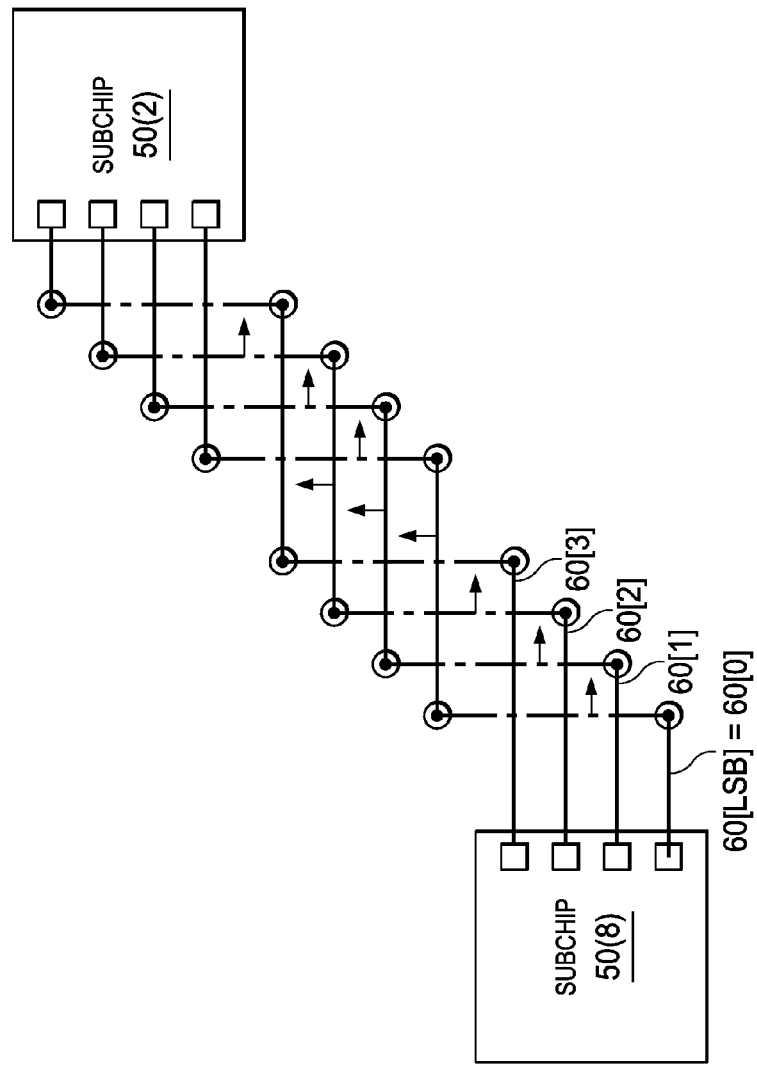

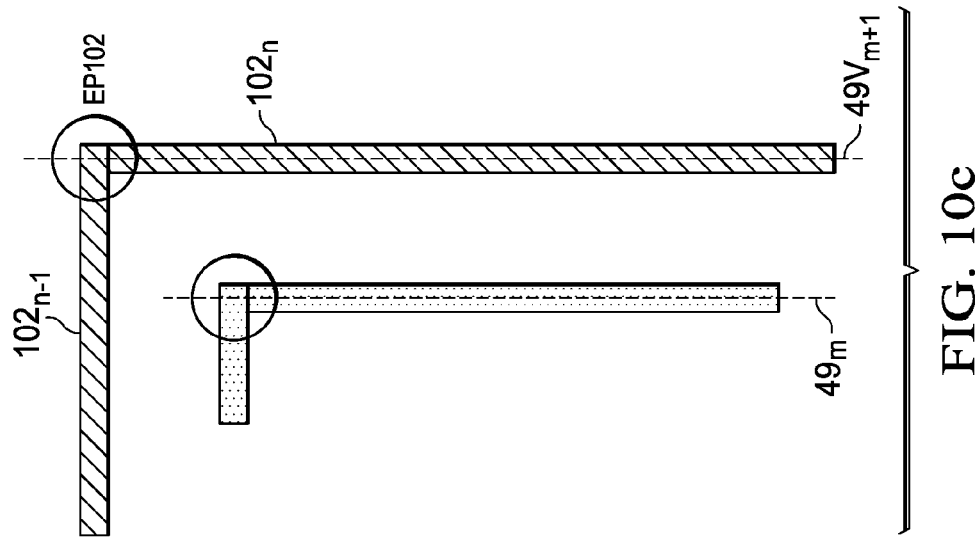
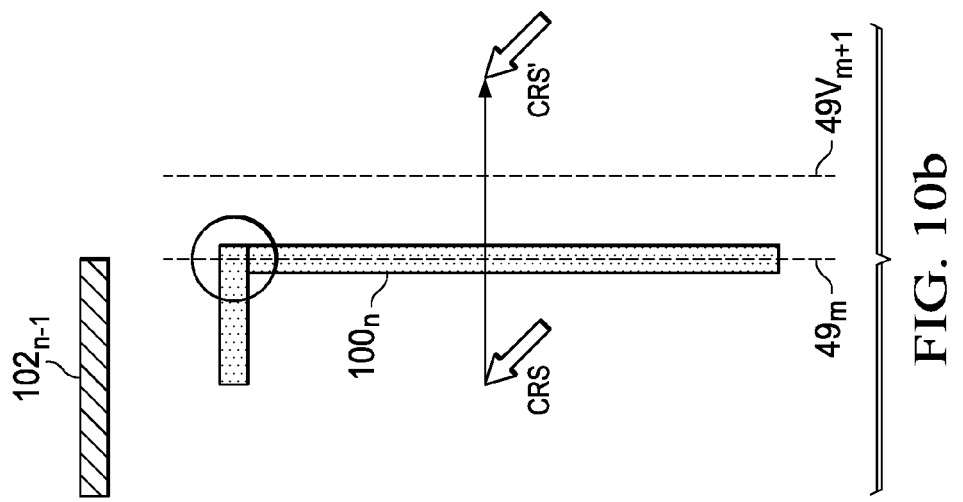
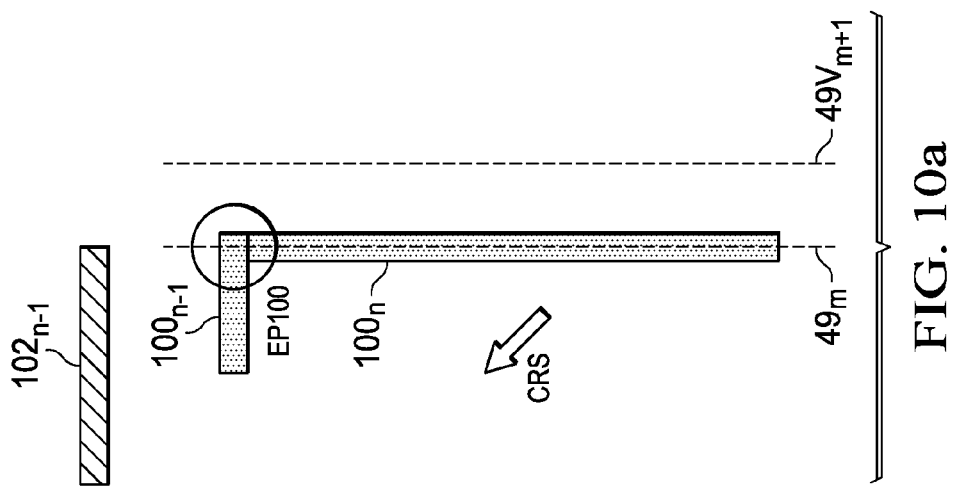

INTERACTIVE ROUTING EDITOR WITH SYMBOLIC AND GEOMETRIC VIEWS FOR INTEGRATED CIRCUIT LAYOUT

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of solid-state integrated circuits. Embodiments of this invention are directed to computer-implemented tools for designing the layout of conductors in such integrated circuits.

Advances in semiconductor technology in recent years have enabled the shrinking of minimum device feature sizes, such as metal-oxide-semiconductor (MOS) transistor gates, into the deep sub-micron range. For example, according to some advanced manufacturing technologies as of this date, the target MOS transistor gate width after etch is on the order of 30 nm. This continuing trend toward smaller device sizes, in combination with continuing improvement in manufacturing technology, have enabled the functionality of very large-scale integrated circuits to greatly increase. A single modern integrated circuit can now contain over one billion transistors, with that number expected to continue to increase as still-smaller technology "nodes" become manufacturable. The ability to realize so many active devices in a single integrated circuit has, of course, resulted in the integration of complex functionality into that integrated circuit, including computing resources operating on very wide data words (e.g., sixty-four bits or wider).

As the number of transistors embodied in a single integrated circuit has increased to such levels, the task of designing the integrated circuit to attain the resulting functional complexity has also become quite complex. Also involved in the implementation of such functionality into an integrated circuit is the task of defining the physical position and physical attributes of each active device, passive device, and interconnection among those devices, to such an extent that photomasks can be created to define those elements in each of the various material layers to be involved in the physical construction of the integrated circuit. As known in the art, this task is referred to as "layout".

A conventional approach to facilitating the design and layout of very large scale integrated circuits, particularly such an integrated circuit that is to carry out a specific function (e.g., a particular computational or control function desired by a system manufacturer), is referred to as the "ASIC" ("Application-Specific Integrated Circuit") design flow. According to this approach, the integrated circuit layout appears as multiple previously-designed and laid-out circuit blocks (i.e., standard cells) for specific functions, memories, and input/output cells arranged in a somewhat regular grid within the rectangular boundaries of the integrated circuit. Interconnections among the various standard cells, I/O blocks, and memories reside in overlying conductor layers.

As known in the art, the ASIC design flow now typically uses commercially-available design tools to convert a system specification into a data file (e.g., the "pattern generation" or "PG" file) from which photomasks can be constructed for manufacture of the integrated circuit. FIG. 1a is a somewhat simplified high-level flow diagram illustrating a typical conventional ASIC design flow. In process 10, the system specifications are defined by the design team. These specifications of course include the desired functionality and performance of the integrated circuit, as well as any constraints (e.g., maximum chip area, power dissipation). In addition, process 10 identifies the manufacturing technology to be used in the manufacture of the integrated circuit (e.g., twin-well CMOS), including the minimum device sizes available for the technology. The specifications defined in process 10 also include functional and architectural specifications, such as the class of instruction set to be implemented (e.g., RISC or CISC), functional features such as pipelining and the number of "cores" for processing units in the integrated circuit. Typical functional and architectural specifications for modern ASICs also break down the overall functionality into various subchips, and identify the relationship between those subchips and the overall, "top-level", system.

These system specifications defined in process 10 serve as the input for logic design process 12. This process 12 implements the system specification into a logic representation of the integrated circuit, for example at a level including sequential or combinatorial logic, Boolean expressions, registers, and the like. This logic representation is typically expressed in a "hardware description language" ("HDL"), as known in the art. Verification that the resulting HDL expression of the integrated circuit corresponds to the higher-level system specifications is typically performed.

In this high-level ASIC flow, the HDL expression of the integrated circuit is then converted into a "gate level netlist" by way of logic synthesis process 14. Conventional synthesis tools are available in the industry to assist the design team in carrying out synthesis process 14. As known in the art, these synthesis tools receive the HDL representation, along with the desired library of "standard cells" available for use in the design, and creates a list of the interconnections, at the gate level, between the various logic functions in the device. Cost constraints are generally applied in synthesis process 14, so that an optimal netlist for a particular manufacturing technology and process can be selected. Typically, in a standard cell ASIC design, the netlist is a complete structural description of the integrated circuit, with each "net" referring to an interconnection among two or more standard cell nodes (or an input/output pad). Simulation can be applied to this structural description, to verify the logic design and perhaps to confirm high level performance.

Physical implementation process 16 turns the netlist and standard cells from process 14 into a geometric representation of the physical layout of the integrated circuit. The desired result of physical implementation process 16 is a data file (PG file) from which photomasks can be generated for use in defining physical features in the various layers of the selected manufacturing technology, in the manufacture of integrated circuits in process 16.

FIG. 1b illustrates a typical flow for carrying out physical implementation process 16, according to conventional approaches. In a general sense, physical implementation process 16 begins with "floorplanning" the integrated circuit (process 13). Floorplanning process 13 defines the high level arrangement of the physical integrated circuit, including identification of the width and length of the eventual integrated circuit. Modern ASIC layouts arrange the subchips (i.e., standard cells, memory blocks, and I/O functions) according to a gridded ("Manhattan") approach. The routing of power supply voltages is also defined in the floorplanning stage, since each subchip will require at least one power supply voltage and a corresponding ground or reference voltage. The location of input/output blocks and external connections "pads" can also be selected in floorplanning process 13. In placement process 15, the locations of the subchips in the floorplan defined in process 13 are selected. Circuit macros and logic gates within each of those subchips are also arranged and located within the physical floorplan as part of placement process 15.

Following placement process 15 (and any verification desired by the design team), routing process 17 is then carried out to define the geometric placement of interconnections between the subchips as placed in process 13, and of course based on the netlist from logic synthesis process 14. According to conventional ASIC layout techniques, a grid of horizontal and vertical "wiring tracks" overlays the layout of the integrated circuit. As mentioned above, the power and ground buses are assigned to specific tracks, generally tracks between the subchips, creating power and ground "meshes" in this overlay. The remaining tracks can be used for interconnects between subchips. In this grid arrangement, interconnects are generally constrained to running either in a horizontal or vertical directions along tracks. Typically, one conductor layer is dedicated to horizontal interconnect segments, and another, adjacent, conductor layer is dedicated to vertical interconnect segments; for example, even-numbered conductor layers (e.g., "the metal 2 level") may be dedicated to horizontal interconnect segments in the x-y plane, with odd-numbered conductor layers (e.g., "the metal 3 level") dedicated to vertical segments in that plane. Vias through the intervening insulator layers form connections among the various conductor layers.

Interconnects in an integrated circuit design can be routed manually, typically by a design engineer interactively selecting the routing path for each interconnect in the layout. Manual routing can provide a highly regular pattern of interconnects, with optimal utilization of wiring tracks and routing resources. However, manual routing is a prohibitively time-consuming, expensive, and error-prone task for modern complex integrated circuits, especially those with many subchips and input/output resources, and ultra-wide data word widths. The difficulties of manual routing are exacerbated as the integrated circuit becomes relatively large in chip area, because the routing of long on-chip interconnect distances, the large number of geometries, and the necessarily-occurring irregularities in such large devices complicate the routing problem. Worse yet, a small change in a routing path, or an interconnect line width, can result in a "domino effect", necessitating changes in hundreds of other interconnects beginning with near neighbors. Manual routing has therefore become essentially impractical for integrated circuits of moderate and higher complexity.

At the other end of the spectrum, automated router software packages ("autorouters") are available for carrying out routing process 17 with greatly improved efficiency relative to manual routing. Autorouter tools operate by deriving an interconnect routing that reflects the netlist of the circuit, as applied to the result of placement process 15. However, it has been observed that wiring derived by such automated routing tools typically appears somewhat random, with little regularity exhibited in the interconnect paths. For example, autorouted integrated circuits typically do not include data bus structures, in which parallel interconnects for multiple bits in a data word run largely in parallel between their endpoints. Rather, the individual wires in potential data buses can follow paths that are largely independent of one another. In addition, it has been observed that autorouters tend to under-utilize the available wiring tracks as compared with manual routing efforts. In the worst case, designs having a significant amount of "top-level" wiring, in the form of wide data buses that heavily utilize the available metal resources, often result in the autorouter not converging to a routing solution.

Some design engineers use a combination of manual routing and autorouting to arrive at the layout of interconnections. For example, the design engineer may manually route some of the interconnects, and allow the autorouter to make the rest of the connections, constrained by the manually routed paths. This combination can attain good area efficiency and regularity in many of the interconnects, while avoiding the painstaking routing involved with the remaining more random wires.

However, conventional layout editors are not well-adapted to support the routing of interconnects; rather, these conventional tools are more adapted to efficiently drawing polygons (i.e., as useful in the layout of small cells). For example, conventional editors display the top level routing of the circuit as a dense "sea of wires", essentially blinding the design engineer from locating available wiring tracks. As a result, modern ASIC designs typically have little top-level wiring that is manually routed.

BRIEF SUMMARY OF THE INVENTION

Embodiments of this invention provide a method and system that facilitates the manual routing of interconnections ("wires") in the layout of a very-large-scale integrated circuit.

Embodiments of this invention provide such a method and system that rapidly recalculates the routing of each wire segment in a group of wires ("bus"), upon a change in the location or properties of one of the wires in that bus.

Embodiments of this invention provide such a method and system that rapidly allows the design engineer to switch back and forth between a geometric view of all wires in a bus, and a "symbolic" view in which only a representative one of those wires in the bus is displayed.

Embodiments of this invention provide such a method and system that results in a compact file storage representation for the routed wires.

Embodiments of this invention provide such a method and system that outputs such a compact file storage representation in the form of a full save file and one or more incremental change files, from which the eventual routing can be rapidly rebuilt when loaded.

Embodiments of this invention provide such a method and system in which functionally unrelated wires can be grouped into a symbolic bus for routing purposes, resulting in less-cluttered routing display for the design engineer, and the ability to rapidly re-map signal names within the symbolic bus.

Embodiments of this invention provide such a method and system in which a "move-next-to" command is available, allowing a new neighboring wire to be routed next to an existing wire without requiring tedious zoom-in operations.

Embodiments of this invention provide such a method and system in which horizontally-running and vertically-running wire segments are automatically assigned to corresponding metal levels, with vias automatically placed at corners in the wire, without requiring specific steps of layer select, via building, and the like.

Embodiments of this invention provide such a method and system that implements the ability to view only selected geometries in the integrated circuit layout, and the wires interconnecting those selected geometries, to reduce clutter in the routing displayed to the design engineer.

Other objects and advantages of embodiments of this invention will be apparent to those of ordinary skill in the art having reference to the following specification together with its drawings.

An embodiment of this invention may be implemented into a computer system, and method of operating a computer system, to assist in the manual routing of interconnections ("wires") in the layout of an integrated circuit, such as an application specific integrated circuit (ASIC). A functional group of wires connecting one subchip to another defines a "bus". In an embodiment of the invention, a human user can define the routing of the bus by interactively drawing the path of a single wire (e.g., the least significant bit position) representative of the routing of the bus in a "symbolic" view. Properties associated with the representative wire specify the remainder of the bus. For example, such properties include the number of wiring tracks occupied by each wire; whether the bus expands to the right and up, or to the left and down, from the representative wire; whether the representative wire is the least significant bit or the most significant bit of the bus; and the number of wiring tracks separating each wire in the bus. Upon defining the single drawn wire, the routing system can readily build the routing of the other wires in the bus, and the user can switch to a "geometric" view of the bus in which the routing of all wires in the bus is shown at the workstation display.

BRIEF DESCRIPTION OF THE SEVERAL VIEWS OF THE DRAWING

FIGS. 1a and 1b are flow diagrams illustrating a conventional design and layout flow for an application specific integrated circuit (ASIC).

FIG. 2 is an electrical diagram, in block form, of a design and layout automation system programmed to enable routing of interconnections in the layout of an integrated circuit according to embodiments of the invention.

FIGS. 4a through 4d are plan views of an example of the layout of an integrated circuit for which interconnections are to be routed according to embodiments of the invention.

FIGS. 7a through 7c are plan views illustrating a bus undergoing routing according to embodiments of the invention.

FIGS. 8a through 8c are plan views illustrating various bus properties associated with a bus undergoing routing according to embodiments of the invention.

FIGS. 10a through 10c are plan views illustrating an example of the operation of the "move-next-to" command, according to that embodiment of the invention.

DETAILED DESCRIPTION OF THE INVENTION

Figure 3:
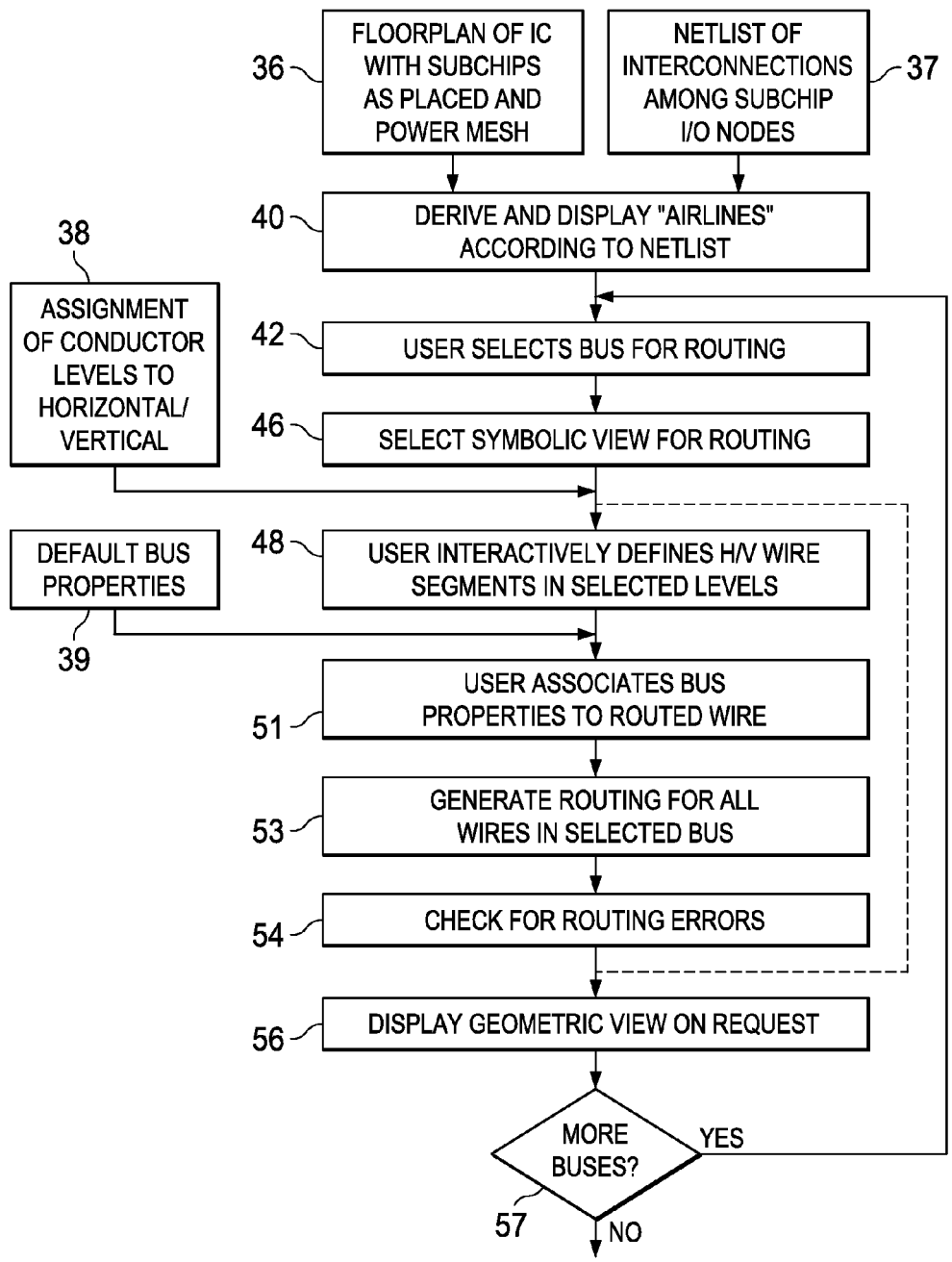
FIG. 3 is a flow diagram illustrating the operation of the system of FIG. 2 in routing interconnections in the layout of an integrated circuit according to embodiments of the invention.

This invention will be described in connection with one or more of its embodiments, namely as implemented into a networked computer system used in the design and layout of an application specific integrated circuit (ASIC), because it is contemplated that the invention will be especially beneficial in such an application. However, it is also contemplated that invention will be useful and beneficial if applied to other design and layout tasks, for other types of devices. Accordingly, it is to be understood that the following description is provided by way of example only, and is not intended to limit the true scope of this invention as claimed.

Design and Layout Automation System

Referring now to FIG. 2, a networked example of design and layout automation system 20 as useful in generating a layout of a VLSI integrated circuit according to embodiments of this invention, will now be described. In this example, system 20 is as realized by way of a computer system including workstation 21 connected to server 30 by way of a network. Of course, the particular architecture and construction of a computer system useful in connection with this invention can vary widely. For example, system 20 may be realized by a single physical computer, such as a conventional workstation or personal computer, or alternatively by a computer system implemented in a distributed manner over multiple physical computers. Accordingly, the generalized architecture illustrated in FIG. 2 is provided by way of example only.

As shown in FIG. 2, workstation 21 includes central processing unit 25, coupled to system bus SBUS. Also coupled to system bus SBUS is input/output interface 22, which refers to those interface resources by way of which a keyboard, a pointing device (mouse, trackball, etc.), display DPY, and other peripheral functions interface with the other constituents of workstation 21. Central processing unit 25 refers to the data processing capability of workstation 21, and as such may be implemented by one or more CPU cores, co-processing circuitry, and the like. The particular construction and capability of central processing unit 25 is selected according to the application needs of workstation 21, such needs including, at a minimum, the carrying out of the functions described in this specification, and also including such other functions as may be desired to be executed by system 20. In the architecture of system 20 according to this example, program memory 24 and data memory 27 are coupled to central processing unit 25 by way of system bus SBUS.

Program memory 24 stores the computer instructions to be executed by central processing unit 25 in carrying out those functions. More specifically, program memory 24 is a computer-readable medium storing executable computer program instructions according to which the operations described in this specification are carried out by system 20, specifically by central processing unit 25 of workstation 21. Alternatively, these computer program instructions may be stored at and executed by server 30, in the form of a "web-based" application, upon input data communicated from workstation 21, to create output data and results that are communicated to workstation 21 for display or output in a form useful to a human user. Data memory 27 provides memory resources of the desired type useful as data memory for storing input data and the results of processing executed by central processing unit 25. Of course, this memory arrangement is only an example, it being understood that data memory 27 and program memory 24 may be included within a unified physical memory resource, or distributed in whole or in part outside of workstation 21.

Network interface 26 of workstation 21 is a conventional interface or adapter by way of which workstation 21 accesses network resources on a network. As shown in FIG. 2, the network resources to which workstation 21 has access via network interface 26 includes server 30, which resides on a local area network, or a wide-area network such as an intranet, a virtual private network, or over the Internet, and which is accessible to workstation 21 by way of one of those network arrangements and by corresponding wired or wireless (or both) communication facilities. In this embodiment of the invention, server 30 is a computer system, of a conventional architecture similar, in a general sense, to that of workstation 21, and as such includes one or more central processing units, system buses, and memory resources, network interface functions, and the like.

Library 32 is also available to server 30 (and perhaps directly accessible to workstation 21 over the local area or wide area network), and stores previously generated design data for the integrated circuit under design. For example, following the conventional ASIC design flow as described above in connection with FIGS. 1a and 1b, the design data for the integrated circuit being designed include the system specifications of that integrated circuit, the hardware description language (HDL) register level description of the integrated circuit, a netlist generated by conventional logic synthesis, data indicative of the floor-planning and placement of subchips at locations of the integrated circuit, design rules, and the like. Additional detail regarding the design data upon which system 20 operates according to embodiments of this invention will be described below. Library 32 may instead or additionally reside on another local area network, or alternatively be accessible via the Internet or some other wide area network. It is contemplated that library 32 may also be accessible to other associated computers in such an overall network, so that other personnel in the design team can simultaneously be carrying out other tasks in connection with this integrated circuit.

Of course, the particular memory resource or location at which library 32 and program memory 24 physically reside can be implemented in various locations accessible to system 20. For example, these data and program instructions may be stored in local memory resources within workstation 21, within server 30, or in remote memory resources that are network-accessible to these functions. In addition, each of these data and program memory resources can itself be distributed among multiple locations, as known in the art. It is contemplated that those skilled in the art will be readily able to implement the storage and retrieval of the applicable information useful in connection with this embodiment of the invention, in a suitable manner for each particular application.

According to this embodiment of the invention, by way of example, program memory 24 stores computer instructions executable by central processing unit 25 to carry out the functions described in this specification, by way of which the physical routing of interconnects in the layout of the integrated circuit under design can be designed. These computer instructions may be in the form of one or more executable programs, or in the form of source code or higher-level code from which one or more executable programs are derived, assembled, interpreted or compiled. Any one of a number of computer languages or protocols may be used, depending on the manner in which the desired operations are to be carried out. For example, these computer instructions may be written in a conventional high level language, either as a conventional linear computer program or arranged for execution in an object-oriented manner. These instructions may also be embedded within a higher-level application.

It is contemplated that those skilled in the art having reference to this description will be readily able to realize, without undue experimentation, this embodiment of the invention in a suitable manner for the desired installations. Alternatively, these computer-executable software instructions may be resident elsewhere on the local area network or wide area network, or downloadable from higher-level servers or locations, by way of encoded information on an electromagnetic carrier signal via some network interface or input/output device. The computer-executable software instructions may have originally been stored on a removable or other non-volatile computer-readable storage medium (e.g., a DVD disk, flash memory, or the like), or downloaded as encoded information on an electromagnetic carrier signal, for example in the form of a software package from which the computer-executable software instructions were installed by system 20 in the conventional manner for software installation.

Operation of the Routing Editor

Embodiments of this invention are directed to the operation of system 20 in assisting the routing of interconnects in designing a physical layout of a VLSI integrated circuit, such as an application specific integrated circuit (ASIC). As will become evident from the following description, embodiments of this invention may be applied to the layout of integrated circuits of essentially any size or complexity, including the billion-transistor ASICs now being commonly produced in the industry. Indeed, embodiments of this invention will facilitate the layout and overall design flow of such highly complex VLSI integrated circuits, as compared with conventional manually or "autorouted" interconnect wiring techniques and tools.

The particular stage of the design flow at which the routing editor of embodiments of this invention may be used to derive the routing of interconnects will depend, in large part, on the manner in which the integrated circuit is being laid out. In the case of the conventional ASIC flow described above relative to FIGS. 1a and 1b, this routing will be carried out within routing process 17, within the physical implementation phase (process 16) of the overall ASIC design flow of FIG. 1a. Of course, the routing editor of embodiments of this invention may be utilized at whatever stage of the design flow that is appropriate, but typically the routing of interconnects in the layout of an integrated circuit depends on the circuit functions being connected in the routing process being already placed within the bounds of the integrated circuit layout. As such, at the time that the routing editor of embodiments of this invention is invoked, the layout of the integrated circuit being designed has already been planned (process 13 of FIG. 1b), and the various "subchips" (i.e., standard cells, memories, input/output blocks, and other partitionable circuit functions) have been placed at locations within that layout (process 15 of FIG. 1b).

FIG. 3 illustrates the overall operation of a routing editor method as executed by system 20, with interactive inputs from and output to a user via workstation 21 in that example, and will now be described. As shown in FIG. 3, floorplan and subchip placement 36, which also includes the locations of the integrated circuit reserved for the routing of power supply and ground voltages to those subchips (i.e., the power "mesh"), is provided as an input to the routing editor method.

Figure 4C:
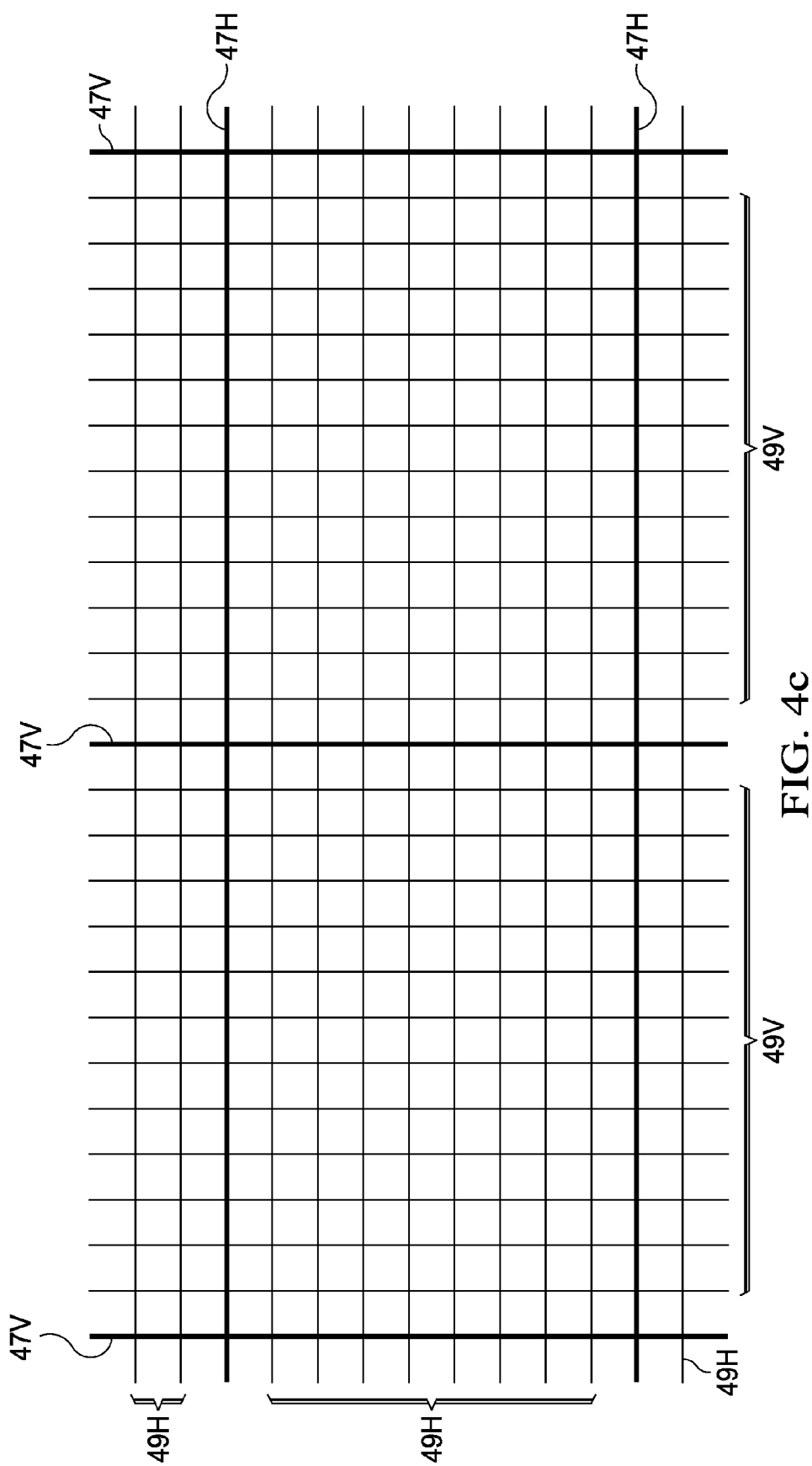

FIGS. 4a through 4c illustrate an example of floorplan and subchip placement 36, by way of context for an example of the routing process described below. FIG. 4a illustrates an example of the floorplan and placement of subchips 50(0) through 50(11) within the chip boundary of integrated circuit 45. As shown by this example, subchips 50(0) through 50(11) are essentially rectangular in shape, but vary from one another in length (in the horizontal dimension in the x-y plane) and height (in the vertical dimension). As mentioned above, subchips 50 each correspond to a collection of circuit functions, examples of such circuit functions including standard cells, memory resources, input/output blocks, one or more logic gates, etc. Not all of the available space may contain an instance of subchip 50, for example as shown in the approximate center of integrated circuit of FIG. 4*a*. Of course, maximum utilization of the chip area is desirable.

FIG. 4*b* shows the placement of power mesh 47, as overlaid onto the arrangement of subchips 50 of integrated circuit 45 shown in FIG. 4*a*. As known in the art, power mesh 47 refers to wiring tracks that are reserved in each conductor level for the routing of power supply and ground voltages to subchips 50 within integrated circuit 45. Typically, signal wiring is prohibited from being routed in those tracks of power mesh 47. In this example, the arrangement and placement of power mesh 47 is included within floorplan and placement 36, applied as an input to the routing editor of this embodiment of the invention.

Floorplan and placement 36 also includes the definition of wiring tracks within integrated circuit 45, an example of which is shown in FIG. 4*c* as overlaid onto a portion of integrated circuit 45, between vertical power tracks 47V and horizontal power tracks 47H of power mesh 47. Wiring tracks 49V run in the vertical direction in the view of FIG. 4*c*, numbering twelve tracks 49V between adjacent vertical power tracks 47V in this example, and wiring tracks 49H run in the horizontal direction, numbering eight tracks 49H between adjacent horizontal power tracks 47H in this example. Each wiring track 49H, 49V refers to a straight line, in the horizontal or vertical direction, respectively, along which the centerline of a conductor of a specified pitch (relative to an adjacent conductor at that same "wire pitch") can be placed. In other words, separate isolated interconnections ("wires") may run along adjacent wiring tracks. The spacing of wiring tracks 49 may vary among the various conductor levels of the integrated circuit; the manufacturing specifications may specify different conductor materials to be used in the various layers, for example.

Also provided as an input to the routing editor according to this embodiment of the invention is netlist 37, as shown in FIG. 3. As discussed above in connection with the Background of the Invention, a netlist is a list of interconnections ("wires", or "nets"), each specifying the nodes to which it is connected. Typically, the netlist also includes a list of the functional modules ("instances"), their attributes (i.e., the type of circuit, typically by reference to a "master" definition), and their ports (i.e., the nodes) that are connected by the wires in the netlist. Signal names may be used as the nomenclature for the wires, if desired. As known in the art, netlist 37 may be in a hierarchical form, in which some instances of modules (e.g., subchips 50) may each contain submodules, which in turn may contain sub-submodules, and so on. The netlist will then specify interconnections at the top level (i.e., among the top level modules), and interconnections among sub-modules at the same level within modules, etc. Another form of netlist is a "flattened" netlist, in which the wires specify their connection to nodes only at the lowest level sub-module (or "primitive") level.

According to this embodiment of the invention, a computer program executing on the computing resources of system 20 (FIG. 2), for example at workstation 21, or at server 30 in a manner accessible to workstation 21 over the appropriate network, operates as a routing editor, by way of which a human user at workstation 21 can interactively define the routing of wires in the layout of integrated circuit 45. As will be appreciated by those skilled in the art, this routing editor system and method provides the important advantages of greatly improving the efficiency of "manual" routing of interconnections within the layout of integrated circuit 45, in a manner that is more readily visible to the user. The efficient routing provided by embodiments of this invention are contemplated to greatly speed up the time and effort required for layout of even complex integrated circuits, particularly of the ASIC type, even if revisions to that routing become necessitated. These and other advantages of this invention will be apparent to those skilled in the art having reference to this specification.

Referring back to FIG. 3, upon receiving the inputs of floorplan and placement 36 and netlist 37, system 20 generates "airlines" for interconnects specified by netlist 37 and requested by the user of system 20, and displays those airlines at graphics display DPY of workstation 21 for viewing by the user, all in process 40. In this example, an airline illustrates a set of interconnections between subchips 50 that system 20 comprehends as belonging to a bus (for example as having a common signal name) as a direct, straight-line (i.e., "as the crow flies") line, without regard to wiring tracks 49. FIG. 4*d* illustrates an example of an airline between subchip 50(2) and subchip 50(8), by way of airline 52. In the example of FIG. 4*d*, airline 52 corresponds to a bus of five parallel signals (e.g., a five-bit wide data word for a signal named "sig_name"— sig_name[4], sig_name[3], sig_name[2], sig_name[1], sig_name[0]). In other words, single airline 52 represents these five physical signal lines in the corresponding bus.

The particular manner in which the user of system 20 selects a particular bus for generation of an airline 52 in process 40 can vary. For example, the user may select a single subchip 50, and request that process 40 generate a display of airlines 52 for all buses connected to that subchip 50, regardless of destination; once displayed, the user may then filter (i.e., exclude from display) those displayed airlines to view only the airlines connecting that subchip 50 to a second selected subchip 50. Alternatively in process 40, the user may select a pair of subchips 50(2) and 50(8), and request that system 20 display airlines 52 for all buses connecting those two subchips 50(2), 50(8). Or the user may select a particular bus, by signal name, in response to which system 20 displays that airline 52. It is contemplated that various presentations of airlines may be generated in process 40 on user request, such similar and alternative presentations being apparent to those skilled in the art having reference to this specification.

Referring back to FIG. 3, once one or more airlines 52 have been derived and displayed in process 40, the user selects one bus represented by a corresponding airline 52 for routing, in process 42. Process 42 is executed by system 20 by receiving inputs from the user, by way of conventional keyboard or pointing device selection and entry. For example, the user may use the pointing device ("mouse") of system 20 to draw a rectangle that is intersected by an airline 52 to select that bus for routing.

According to this embodiment of the invention, system 20 is capable of displaying wires routed among the various subchips 50 of integrated circuit 45 in a conventional geometric view, in which each wire in each bus is individually displayed in its currently routed path, and also in a "symbolic" view in which only a single representative wire in each bus is displayed in its currently routed path. In the symbolic view, the representative wire has various properties attached to it, from which the physical size and routed locations of its sister wires in that same bus can be deduced. Those skilled in the art having reference to this specification will recognize that the view of the layout of integrated circuit 45 at graphics display DPY of workstation 21 will of course be far less cluttered in the symbolic view than in the geometric view, although the symbolic view will of course not convey the physical space occupied by the various buses. It is contemplated that this ability of the routing editor executed by system 20 will thus provide the design engineer, as the user of system 20, with a great deal of flexibility and visibility into the routing of sub-chip interconnections, and facilitate the manual routing and editing of that routing in the layout phase of the design flow.

Figure 5A:
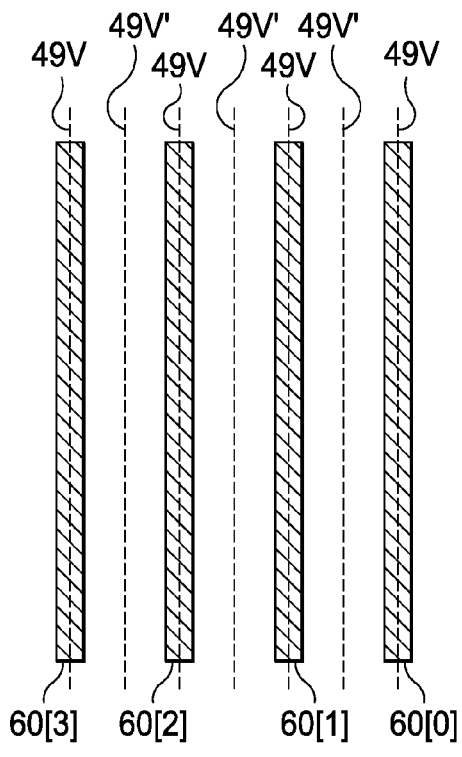
FIGS. 5a and 5b are plan views of geometric and symbolic representations of a bus in an integrated circuit layout, as displayed according to embodiments of the invention.
Figure 5B:
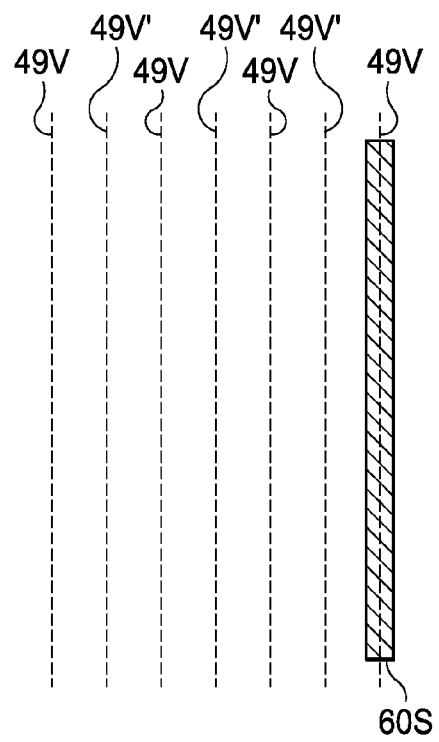

FIGS. 5a and 5b illustrate segments (either as airlines 52, or as wire segments generated as described below) of bus 60 in its geometric and symbolic views, according to an example in which bus 60 is four bits wide. In the geometric view of FIG. 5a, segments of each of the four wires 60[3] through 60[0] are illustrated, with the layout width of those wires shown as centered along respective vertical wiring tracks 49V; the physical line width and spacing of each of wires 60[3] through 60[0] is determined by the pitch of tracks 49V relative to one another, so that adjacent tracks 49V can each carry a corresponding wire 60. In the example of FIG. 5a, empty tracks 49V' are left between wires 60[3] through 60[0], permitting wires from a different bus to be interleaved with bus 60 along those wiring tracks 49V'. FIG. 5b, on the other hand, illustrates bus 60 in its symbolic view, in which "symbolic" bus 60S is in the form of a single wire structure, representative of all wires within bus 60. In this example, symbolic bus 60S resides in the position of least significant wire 60[0] of bus 60 in the geometric view, along an instance of vertical wiring track 49V; alternatively, as will become apparent from this description, the representative wire may instead be the most significant wire 60[3] (in this example). As will be described in further detail below, properties of bus 60 and its wires 60[3] through 60[0] will be stored in memory of system 20, in associated with the position information of symbolic bus 60S, from which the geometric view of bus 60 by way of wires 60[3] through 60[0] can be readily generated.

Of course, the user may route each wire of a bus manually (using the physical view); such an approach would correspond to conventional manual routing. According to embodiments of the invention, however, in process 46, the user of system 20 selects the symbolic view for display of selected bus 60 for interactive routing by the routing editor executed by system 20, as will now be described. This selection of the symbolic view in process 46 may be a default condition of system 20, or may be selected by the user prior to identification of bus 60 to be routed (process 42). According to this embodiment of the invention, the wires of selected bus 60 will be realized as orthogonal segments, each segment running parallel to one of the sides of integrated circuit 45.

In process 48, the user interactively defines the routing of the representative wire (i.e., interconnection) of the selected bus 60 using the symbolic view. System 20 maintains list 38 of conductor level assignments, which is provided as an input to process 48. This list 38 enforces a scheme by way of which certain conductor levels (e.g., even-numbered metal layers) are reserved for horizontal-running wire segments (in the orientation of FIG. 4c), and other levels (e.g., odd-numbered metal layers) are reserved for vertical-running wire segments. Given the constraints of list 38, the user will select an available conductor level for each segment of routing of the wires of selected bus 60. Typically, one level will be used for all horizontal-running wire segments for the selected bus 60, and another level will be used for all vertical-running wire segments for bus 60, although in some cases a bus may be routed using more than three conductor levels. For the two-level case, the selected conductor levels are typically adjacent to one another in the manufacturing flow (e.g., metal 2 and metal 3).

According to an embodiment of this invention, the user can select two conductor levels for the routing of a wire; in this case, one of the selected levels will be used for wire segments in one orientation (e.g., horizontal) and the other selected level will be used for wire segments in the other, orthogonal, orientation (e.g., vertical). Typically, the selected pair of levels will be adjacent to one another among the multiple conductor levels of the integrated circuit (e.g., metal 2 and metal 3). This selection of the two conductor levels eliminates the need for the user to select a conductor level prior to drawing each wire segment; rather, the user can draw each orthogonal wire segment in the wire, while system 20 assigns the appropriate one of the two currently-selected conductor levels to each wire segment consistently with its orientation. In this embodiment of the invention, the user can change either or both of the selected conductor levels at any time during the drawing of the wire, with subsequent wire segments then assigned to the newly-selected conductor levels. This assignment of two conductor levels may be made available for use in routing wire segments in either the symbolic view or the geometric view.

Figure 6:
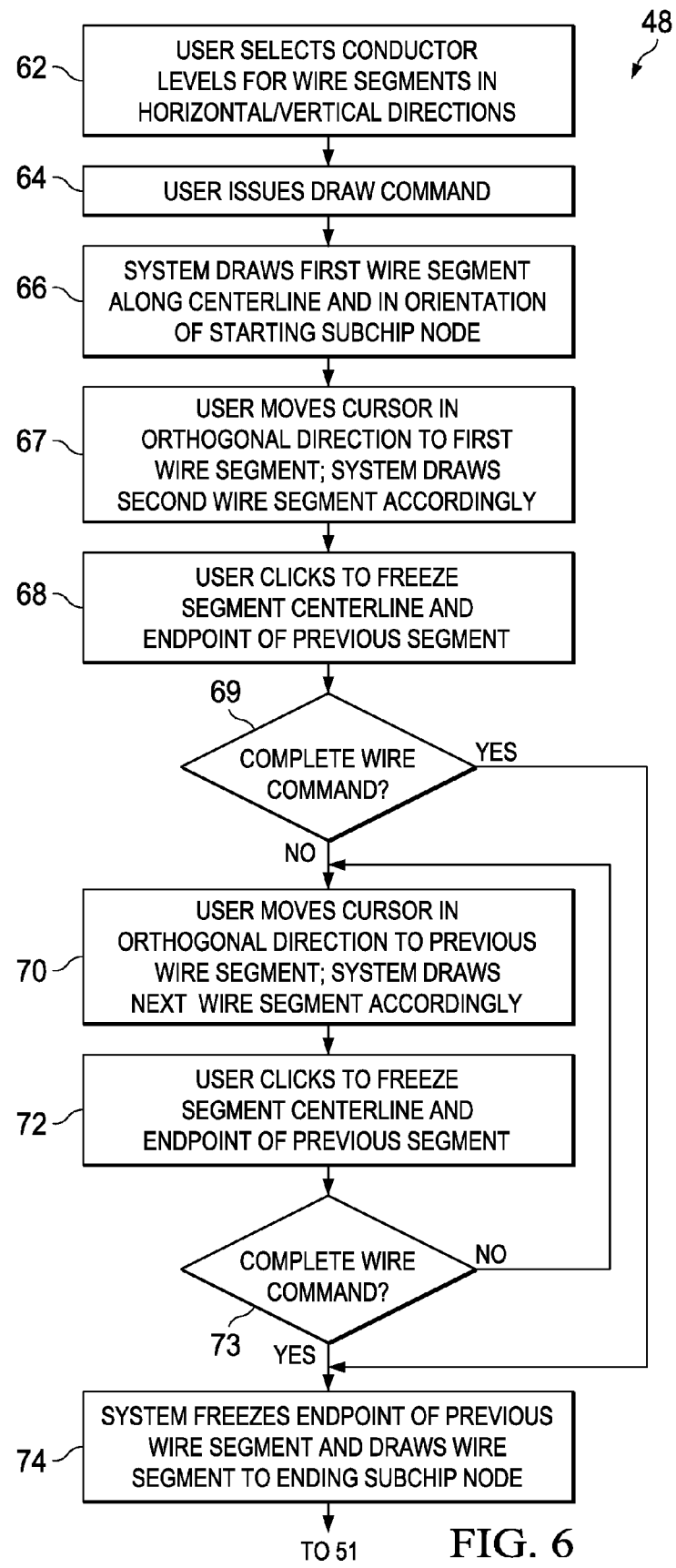
FIG. 6 is a flow diagram illustrating the interactive routing of a representative wire in a bus of an integrated circuit, according to embodiments of the invention.

Referring now to FIG. 6 in combination with FIGS. 7a through 7c, an example of process 48 for the interactive routing of the representative wire in selected bus 60 according to an embodiment of the invention will be described in further detail. As discussed above, the user has already selected bus 60 for routing, and system 20 has been instructed to use the symbolic view of that bus 60 for its routing, displaying the routed portions of bus 60 by way of a single representative wire (corresponding to the least significant bit, or most significant bit, of bus 60). Routing process 48 begins with process 62, in which the user of system 20 selects the applicable conductor levels for the orthogonal (horizontal and vertical, in the x-y plane) segments of bus 60 to be routed, for example one conductor level for horizontally-oriented wire segments and one conductor level for vertically-oriented wire segments. As mentioned above, if a given bus is to be routed using more than two levels, process 62 may be repeated by the user at the appropriate point within process 48, to change either or both of those selected levels as desired.

In process 64, the user then issues a "draw" command to system 20, indicating that movement of the cursor by the user (by way of a pointing device or other human interface device in combination with graphics display DPY at workstation 21) is to be interpreted by system 20 as routing conductors for selected bus 60. This "draw" command of process 64 may be performed by a menu command or a particular key stroke.

Once the "draw" command is issued, system 20 begins operating to "draw" a wire segment at display DPY in the appropriate location in response to operation of the pointing device by the user, in process 66. It is contemplated that process 66 will be executed by workstation 21 of system 20 in a user-friendly manner. In the example of FIG. 6, workstation 21 extends the first wire segment (from the node of subchip 50 for the selected bus closest to the current cursor location) along the wiring track aligned with that starting node, and in the orientation indicated by the current cursor position (e.g., if the cursor is farther away from the starting node in the horizontal direction than in the vertical, the first wire segment will run horizontally). For wire segments after the first wire segment from a subchip 50, workstation 21 will "follow" the current cursor location as the user moves the pointing device in a direction orthogonal to the first wire segment in process 67, drawing a next wire segment in the appropriate selected conductor level (from process 62) orthogonally from that first wire segment of bus 60. The centerline of this second wire segment (and thus the endpoint of the previous wire segment) follows the cursor position during this process 67. Upon the user "clicking" the mouse or other pointing device with the displayed cursor in the desired location, in process 68, workstation 21 then freezes the orientation, conductor level, and centerline of that second wire segment, and the endpoint (and thus the length) of the first wire segment, in its display of the layout of integrated circuit 45 at display DSY.

FIG. 7*a* illustrates an example of a portion of a layout at display DSY during process 66 in which a horizontal-running first wire segment SEG(1) is being drawn from start node SN[LSB] at sub-chip 50(2). In this example, window W indicates that metal levels M2, M3 are the two currently-selected conductor levels, and as such, this first wire segment SEG(1) will thus be associated with the appropriate one of those levels for its direction. For this first wire segment SEG(1), its centerline position (i.e., its assigned horizontal track) is defined by the location of start node SN[LSB], and its orientation as horizontal is defined by the current cursor position, as mentioned above. As suggested by FIG. 7*a*, the endpoint of this first wire segment SEG(1) is not yet defined along the horizontal direction.

In process 67, the user moves the cursor in a direction orthogonal to first wire segment SEG(1), vertically in the example of FIG. 7*b*. Workstation 21 accordingly draws a next wire segment SEG(2) for selected bus 60, with its centerline (i.e., selected vertical wiring track) following the cursor position as controlled by the user. This next wire segment SEG(2) will be associated with the selected conductor level (process 62) associated with that orthogonal direction. Typically, this conductor level will be an adjacent level to that selected of the previous wire segment. In process 68, the user executes a "click" of the pointing device of workstation 21, following which system 20 freezes the orientation, conductor level, and centerline position of that second wire segment SEG(1). Once the centerline of second wire segment SEG(2) is selected in process 68, endpoint EP(1) of this first segment SEG(1) is also then defined and frozen, as shown in FIG. 7*b*.

Decision 69 is then executed by system 20 to determine whether the user is issuing a "complete wire" command via workstation 21. It is contemplated that this termination command will typically be indicated by a special "click" of the pointing device; alternatively, system 20 may itself determine whether the routing of bus 60 is at its termination point, for example by determining whether the current cursor position is sufficiently at the terminating node indicated by netlist 37 for this selected bus 60. In any case, if the drawn wire segment is not at its termination point (decision 69 is "no"), process 70 is then executed to draw the next wire segment in a direction orthogonal to the previous wire segment, following the current position of the cursor as in process 67. In process 72, system 20 receives a mouse click or other command from the user, in response to which it freezes the centerline (i.e., wiring track) of that next wire segment in the appropriate orientation and at the selected conductor level, and freezes the endpoint of the previous wire segment, as in process 68 described above. As shown in FIG. 6, decision 73 determines whether system 20 is to complete the routing of bus 60, again as may be indicated by the user by way of a special mouse "click" as in decision 69. If not (decision 73 is "no"), control returns to processes 70, 72 in which system 20 draws the next wire segment orthogonally to the previous segment according to the cursor position under user control. Processes 70, 72 continue until decision 73 returns a "yes" result indicating that the routing of selected bus 60, in its symbolic view, is to be completed.

In that case, system 20 executes process 74 to complete the routing by freezing the endpoint of the previous wire segment, and drawing the final wire segment from that endpoint to the corresponding termination node of the destination subchip 50. As in the case of the first wire segment, the centerline of this final wire segment is defined by the location of the termination node at the destination subchip 50. FIG. 7*c* illustrates the result of an example of a completed wire, between start node SN[LSB] at subchip 50(2) and termination node TN[LSB] at subchip 50(8). In this example, the wire includes segment SEG(1) running horizontally between start node SN[LSB] and endpoint EP(1), segment SEG(2) running vertically (and thus in a different conductor level) from endpoint EP(1) to its endpoint EP(2), segment SEG(3) running horizontally between endpoint EP(2) to its endpoint EP(3), and so on until segment SEG(5) extends to termination node TN[LSB]. In this example, completion decision 73 is executed after the user has extended horizontal wire segment SEG(5) from vertical wire segment SEG(4); process 74 then freezes endpoint EP(4) of wire segment SEG(4), and freezes the centerline of wire segment SEG(5) running between termination node TN[LSB] and wire segment SEG(4). The routing of bus 60 by way of its representative wire 60[0] in the symbolic view is then complete.

As known in the art, a via is an eventual photomask location at which an opening in the intervening insulator layers will be made between the physical conductor representing the conductor levels involved in making the connection at that location. As will be mentioned below, system 20 will place vias between the conductor levels involved in the routing of selected bus 20, at the locations of the defined endpoints between wire segments, between the conductor levels corresponding to those wire segments.

Referring back to FIG. 3, upon the interactive routing of the wire segments of the representative wire of bus 60 by process 48, certain properties of selected bus 60 are then associated with each wire segment in the newly-derived routing, in process 51. According to this embodiment of the invention, these bus properties provide the additional information necessary to physically route each of the wires of selected bus 60, given the routing of the representative wire of bus 60 that was interactively derived in process 48 via the symbolic view. In the general case, these properties can differ for different wire segments of the same bus 60; for example, horizontal segments of bus 60 may have one set of bus properties, while vertical segments of that same bus 60 may have a different set of bus properties.

Figure 8A:
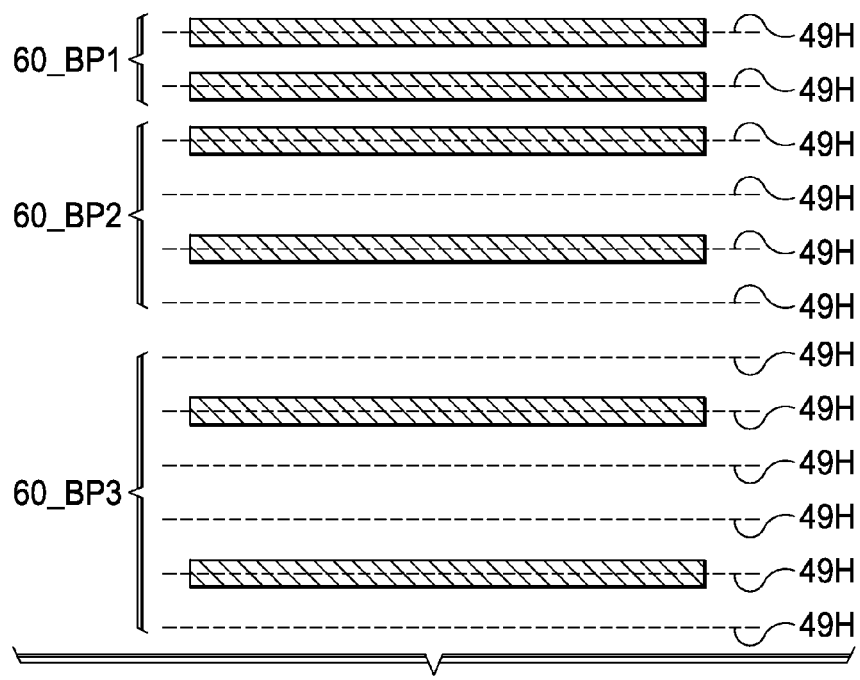

According to embodiments of this invention, one bus property for selected bus 60 is its "bit pitch", which is the distance, in wiring tracks, between the wires for adjacent bit positions in bus 60. FIG. 8*a* illustrates examples of buses with varying bit pitch, each using an example of two bits in the bus; it will be understood, of course, that the number of bit positions, and thus wires, in each bus of integrated circuit 45 will typically be much larger in number. FIG. 8*a* illustrates horizontal-running wire segments of three different buses, routed along horizontal wiring tracks 49H. Bus 60_BP1 shown in FIG. 8*a* includes two wires along adjacent wiring tracks 49H; as such, bus 60_BP1 has a bit pitch of one wiring track. Stated differently, the distance in wiring tracks from the centerline of one wire to and that of an adjacent wire in bus 60_BP1 is one wiring track. Bus 60_BP2 of FIG. 8*a* also has two wires, each disposed along a wiring track 49H, but separated by a (currently) vacant wiring track 49H. The distance between wires in bus 60_BP2 is thus two wiring tracks 49H, and as such the bit pitch of bus 60_BP2 is two wiring tracks. FIG. 8*a* also illustrates bus 60_BP3, with its adjacent bit position wires disposed along wiring tracks 49H that are separated by two (currently) vacant wiring tracks 49H. As such, the distance between the centerlines of wires carrying adjacent bits in bus 60_BP3 is three; bus 60_3_ thus has a bit pitch of three wiring tracks.

The ability to use a bit pitch of larger than one in the routing of wires in the layout of integrated circuit allows for the interleaving of functionally different buses with one another in that layout. Stated differently, wires of one or more buses unrelated to bus 60_BP3 can be routed in those vacant wiring tracks 49H disposed between the wires of adjacent bit positions of bus 60_BP3. This interleaving can facilitate the routing of buses in integrated circuit 45, such that buses may not need to be fully detoured around one another in many instances.

The routing and placement of the various wires within a given bus 60 according to the specified (or default) bit pitch takes into account those wiring tracks that are associated with power and ground lines. In embodiments of this invention, the bit pitch value is expressed in "user" tracks (i.e., those wiring tracks available for routing signal lines). Wiring tracks that are reserved for power and ground are not counted. For example, if one wire in a bus is placed immediately adjacent to wiring tracks assigned to power and ground lines, the next wire in that bus will be placed, at a bit pitch of "1", in the next available "user" track on the other side of those reserved power and ground tracks, which will be some distance away from its neighbor in the bus.

While the examples of bit pitch shown in FIG. 8*a* correspond to a single value for the entire bus, it is also contemplated that the pitch between bits within a bus can be less regularly specified and associated with the bus. In an extreme case, the bit pitch between each pair of adjacent bus lines in the bus may be individually specified. Another available approach may be to specify the bit pitch by a repeating sequence of values; for example, a bit pitch sequence of (1, 1, 3) may specify that every third wire in the bus is at a distance of three wiring tracks from its predecessor.

Figure 8B:
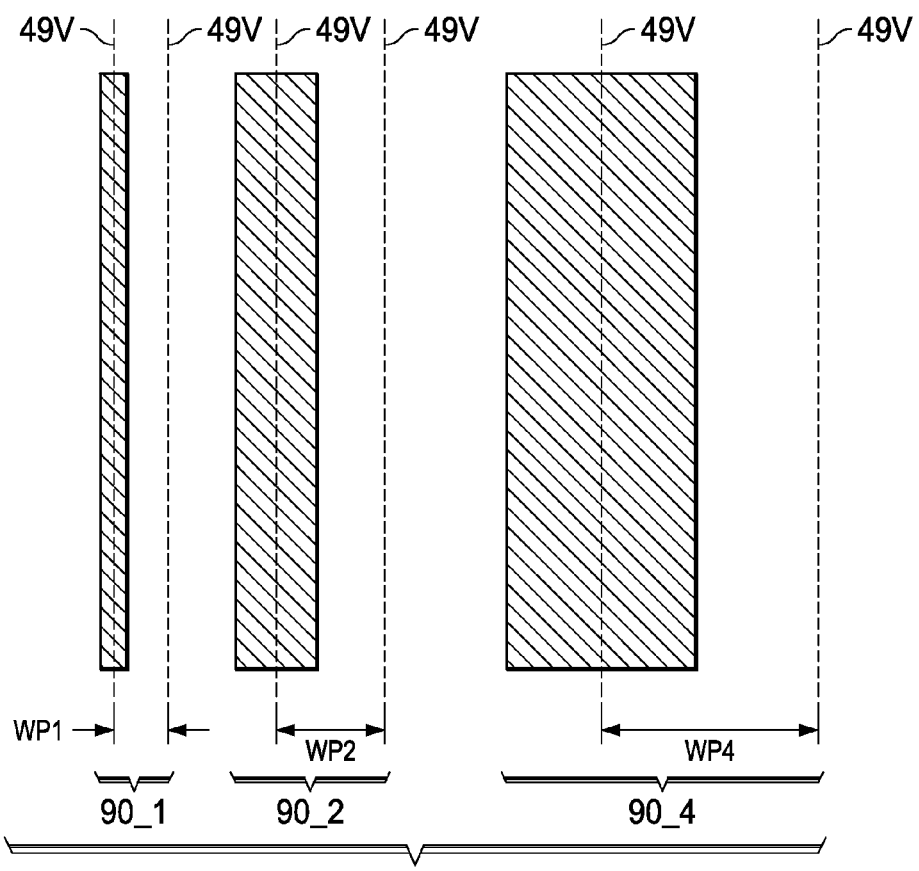
Figure 9:
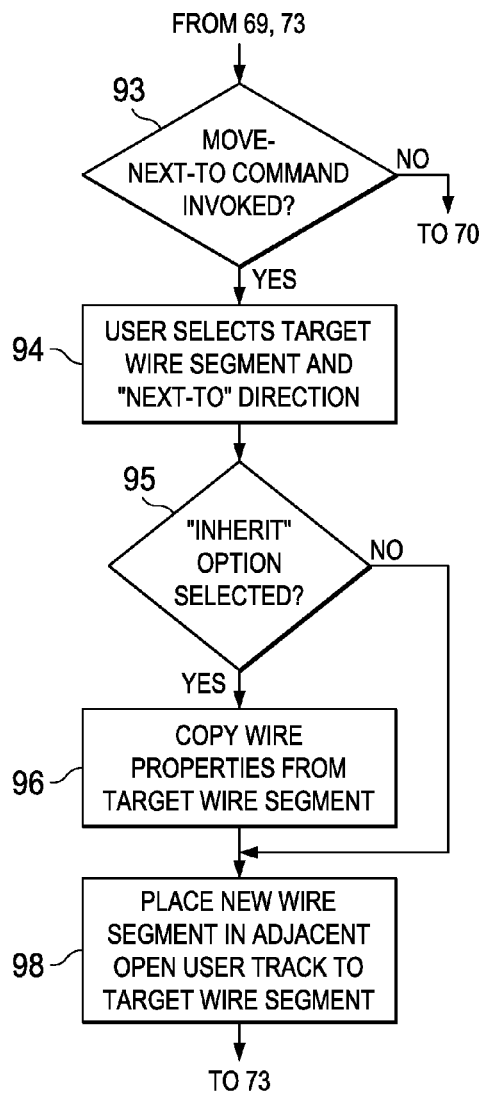
FIG. 9 is a flow diagram illustrating the operation of a "move-next-to" command in the interactive routing of wires and buses in an integrated circuit, according to an embodiment of the invention.

Another bus property associated with selected routed bus 60, in memory resources of system 20, is its "wire pitch". According to embodiments of this invention, the wire pitch property corresponds to the physical pitch (width plus spacing) of adjacent wires (i.e., at a bit pitch of "1") within the particular bus 60, expressed as a number of wiring tracks of minimum pitch for its particular conductor layer, specified in the applicable design rules. As known in the art, design rules pertaining to conductor width in an integrated circuit can be affected by the maximum current density of its conductors, typically depending on the material composition of that conductor. If the circuit design requires a conductor to carry relatively high current, the current density specification may require the use of a wider conductor for that particular signal. Switching speed (i.e., R-C time constant) considerations may also require the design engineer to provide wider conductors for some buses within the integrated circuit. FIG. 8*b* illustrates three wires 90_1, 90_2, 90_4 at varying wire pitch. In this FIG. 8*b*, wire 90_1 shows a wire pitch of "1" (i.e., at a minimum physical pitch), relative to an adjacent wiring track 49V. Wire 90_2 has a wire pitch of "2", such that the physical distance to the adjacent (unoccupied) wiring track 49V is twice that of the wire pitch of wire 90_1. Wire 90_4 has a wire pitch of "4", which is twice the wire pitch of wire 90_2, and four times the wire pitch of wire 90_1.

As evident from FIG. 8*b*, the bit pitch and wire pitch properties are related to one another, in the sense that a change in the wire pitch will necessitate a change in the physical spacing of adjacent wiring tracks. In other words, buses of different wire pitch operate according to different resolution grids of wiring tracks. As a result, each available wire pitch value has an associated set of potential "user" wiring tracks in the corresponding conductor level, between reserved power and ground wiring tracks as described above. It has been discovered, in connection with this invention, that it is useful to arrange the number of user wiring tracks (at minimum wire pitch of "1") between power tracks to cleanly and efficiently interleave signal conductors of varying wire pitch in that conductor level. For example, wire pitch "2" segments can efficiently interleave with wire pitch "1" if the number of user tracks between power wires is even; this is because n tracks at wire pitch "1" between power rails will support n/2 tracks at wire pitch "2". Similarly, to interleave wire pitch "3" wire segments with wire pitch "1" segments, the number of user tracks between power wires should be a multiple of three. Twenty-four user tracks between power rails provides a great deal of interleaving flexibility, as wire segments at wire pitches of "1", "2", "3", "4", etc. can be efficiently interleaved over those twenty-four tracks. Non-integer wire pitches can also be used, e.g., a wire pitch of 3/2.

Other bus properties associated with each segment of bus 60 refer to the manner in which bus 60 is to be expanded from it symbolic view to its geometric view. One bus property (LSB/MSB) indicates whether the representative wire shown in the symbolic view, and routed by the user in process 48, corresponds to the least significant bit or the most significant bit of its bus 60. Other bits from the bus may alternatively be specified, but it is contemplated that the use of internal bus bits in the symbolic view will generally be less convenient. Another bus property, related to the LSB/MSB property, indicates the directions in which bus 60 is to expand from the representative wire in the symbolic view. According to this embodiment of the invention, the bus may expand either up or down from a representative horizontal wire segment, or either left or write from a representative vertical wire segment. This directional bus property may be expressed by way of a single bit value (e.g., "0" indicating up/right, and "1" indicating down/left), or alternatively by a sign indication with the bit pitch property value (e.g., "+" indicating up/right, and "−" indicating down/left).

The LSB/MSB and directional bus properties are related in the sense that the values of these properties cooperate with one another in the expansion of bus 60. This relationship and effect of these properties is illustrated by way of an example in FIGS. 7*c* and 8*c*. As described above, FIG. 7*c* is the symbolic view of an example of bus 60 between subchips 50(2) and 50(8), following the routing of its representative wire 60[0]; in this example, LSB/MSB bus property of this representative wire 60[0] indicates that it is the "LSB" of bus 60. FIG. 8*c* illustrates a physical view of the routing of wires 60[x] of bus 60 for the case which the directional property of its horizontal segments is "right" and the directional property of its vertical segments is "up". In this example, the vertical positions of those segments of wires 60[x] that terminate at one of sub-chips 50(2), 50(8) are determined by the vertical position of the pads at those sub-chips 50(2), 50(8), rather than by the bus property values. The horizontal position of vertical segments of wire 60[1] thus lies to the right of corresponding vertical segments of LSB wire 60[0], and the vertical position of the horizontal segment of wire 60[1] thus lies above the vertical segment of LSB wire 60[1]. Wires 60[2], 60[3] are similarly positioned relative to their respective lower bit position neighbor in bus 60, as bus 60 expands from LSB to MSB. Of course, the horizontal wire segments of bus 60 reside in a different conductor level than its vertical wire segments, such that vertical segments of wires 60[x] cross its horizontal segments, and vice versa.

Referring back to the operation of system 20 in carrying out the routing editor, as shown in FIG. 3, the user selects the appropriate bus properties to be associated with the representative wire for selected bus 60 routed in process 48. It is contemplated that default values for these bus properties may be stored by system 20 (input 39 to process 51); for example, these default values may be "1" for both bit pitch and wire pitch, and "LSB" and "up/right" also set as defaults. In process 51, the user may simply adopt these default values (e.g., by doing nothing), in which case system 20 will associate these values of bus properties with the newly routed bus 60 as property data, along with its routing data as derived in process 48. Alternatively, the user may modify these bus properties for routed bus 60 as desired, in process 51, and those bus property values for bus 60 will be stored by system 20 in association with the routing data from process 48. The default property values may be set individually by the user for each conductor level.

Alternatively, the association of the bus properties in process 51 may be performed prior to process 48, if desired.

Upon the definition of the routing data for the representative wire for selected bus 60 in process 48, 48', and the association of the property data with bus 60 in process 51, system 20 then generates (i.e., "builds") the physical routing for all wires in that bus 60 in process 53. In process 54, system 20 displays any routing errors that are caused by the routing of bus 60. For example, as mentioned above, the assignment of wiring tracks to signal lines such as in bus 60 is made according to the bit pitch of each segment of that bus 60, with power and ground tracks reserved and not included within the available signal tracks. Also in process 54, system 20 examines the routing of the newly-routed bus 60, to determine whether any routing errors are present; if so, the user of system 20 is alerted, for example by way of a visible indicator or error message at workstation 21. For example, according to one embodiment of this invention, those wiring tracks that are already occupied (i.e., already associated with a wire in a different bus) are not reserved; as such, the building and expansion of newly-routed bus 60 may result in a second conductor being applied to a wiring track in one of the conductor levels. The short circuit resulting from such double-assignment of a wiring track to wires in two buses is displayed to the user in process 54. Process 54 also checks for other types of routing errors, such as a "design rule check" violation in which wire segments of different wire pitch are placed too closely to one another (insufficient separation). Following the display of routing errors at workstation 21 in process 54, the user can then revise the current routing or bus properties of bus 60 (in process 48) or other buses and structures.

Either automatically or upon request by the user, system 20 can now display bus 60 in its geometric view, at display DPY of workstation 21 in process 56, for review and analysis by the user as desired. This geometric view will provide a view of all lines of bus 60 similar to that shown in FIG. 8c. Preferably, system 20 can be toggled by the user between the geometric view and the symbolic view, as desired for analysis of the current routing of bus 60.

Upon completion of the routing for selected bus 60, data representative of that routing are stored by system 20 in an appropriate one of its memory resources (e.g., library 32). These stored data for bus 60 include routing data indicative of the location of the wire segments of the representative wire of bus 60 (e.g., the wire associated with the least significant bit, or the most significant bit, as the case may be) and also the conductor levels in which those segments are to be fabricated (from which the location of vias between those levels may be inferred), and associated property data indicative of the values of bus properties for deriving the routing of the other wires in that bus 60 from the routing data for its representative wire. The combination of the routing data and property data is contemplated to completely specify the data necessary for the fabrication of photomasks or the like, by way of which bus 60 can be fabricated in actual integrated circuits.

It is contemplated that, upon the routing of other buses and conductors for the layout of integrated circuit 45, it may become useful to edit the routing of a previously routed bus. According to an embodiment of the invention, the form in which the routing data and property data for each bus can be quite efficient. In this embodiment of the invention, a database entry for the routing of bus 60 may be stored in a format that includes the routing data for each wire segment, and the bus property data; to further optimize storage, only store those bus property values that differ from default bus property values 39. Also according to this embodiment of the invention, it is contemplated that subsequent edits to the initial routing of bus 60 may be stored as incremental change files, including the file name at which the routing and property data corresponding to the initial routing are stored, in combination with an incremental save file for each modification to that initial routing. Those modifications may include such changes as the addition of wire segments (both routing and property data for that segment), deletion of wire segments from the initial routing, and changes to property values (specifying the particular wires, wire segments, and property names and values). As a result, the design and layout work previously applied to integrated circuit 45 is less vulnerable to loss in the event of a "crash" of system 20.

Decision 57 is executed by system 20, after the storing of routing and property data for bus 60 in process 56, to determine whether additional buses are to be routed in this user session. If so (decision 57 is "yes"), control returns to process 42 in which the user selects the next bus to be routed; the airlines or other representation of those buses from which to select may be displayed (process 40) in advance of selection process 42, if desired by the user.

According to another embodiment of the invention, an additional command is provided by system 20 to the user in the routing of a next bus or an additional individual wire (i.e., not associated with a bus), following the completion of the routing of bus 60. As known in the art and as evident from the foregoing description, the spacing between adjacent conductors in the layout of integrated circuit can be orders of magnitude smaller than the length of those conductors, especially for signal line conductors between subchips 50. For example, the spacing between wire tracks in a modern integrated circuit 45 may be on the sub-micron scale, while the distance between subchip pins may be on the order of one or more centimeters.

In some cases, the layout engineer may wish to route a subsequent bus or wire in a wiring track adjacent to a previously routed bus or wire, for example if that next bus is connecting the same two subchips 50 (perhaps adjacent pins or nodes of those same subchips 50) as the previously routed bus. In order to effect that routing using conventional routing and layout systems, the user is required to repeatedly zoom out the displayed layout in order to view the overall path of the conductors, and then zoom in the display in order to place a segment of the next wire. In many cases, the length of a particular segment relative to its spacing may require zooming in and out during the drawing of that wire. This repeated zooming is not only tedious, but is also error-prone.

According to this embodiment of the invention, system 20 is programmed to include a "move-next-to" command as an optional command within process 48, as will now be described by way of example with reference to FIGS. 9 and 10a through 10c. In this embodiment of the invention, a "move-next-to" command is invoked by the user at workstation 21 to initiate routing of a wire segment (i.e., after decision 69 or 73 of FIG. 6 indicating that this wire segment is not a terminating segment), which will indicate to system 20 that a wire segment to next be routed by the user is to be placed in the next available user wiring track adjacent to a previously-routed wire segment (the "target" wire segment), for example the representative wire for a bus 60 as displayed in the symbolic view. This "move-next-to" command is a distinct command from the "draw" command used to explicitly route a wire segment, for example in the manner described above. It is contemplated that the move-next-to command may be indicated by making a mouse drag gesture (i.e., a mouse key pressed and held during a cursor movement, and then released), or in other various ways. A keystroke combination may be associated with the move-next-to command, to allow user selection of optional features in the command, an example of which is an "inherit properties" option as will be described below.

Decision 93 is executed by system 20 to determine whether the move-next-to command was invoked by the user; if not (decision 93 is "no"), explicit routing of the next wire segment is performed via processes 70, 72 as described above relative to FIG. 4. If the user did invoke the move-next-to command (decision 93 is "yes"), process 94 is executed, in which the user selects the target wire segment, next to which the wire segment to be routed is to be placed. As mentioned above, this target wire segment may be a segment of a wire in previously-routed bus 60, or another wire not resident in a bus. In addition, the user also indicates to system 20, in process 94, the relative side of that target wire segment at which the wire segment currently being routed is to be placed. FIGS. 10a and 10b illustrate an example of selection process 94, in the example of the routing of a wire segment $102_n$ in an integrated circuit 54. FIG. 10a illustrates target wire segment $100_n$ prior to the invoking of a move-next-to command, in an example. Target wire segment $100_n$ is a vertical wire segment in that view, extending downward along vertical wiring track $49V_m$ from endpoint EP100 of a previous wire segment $100_{n-1}$ for that same conductor. In this example, wire segment $102_{n-1}$ is an existing wire segment of the wire for which new wire segment $102_n$ is to connect; at this point in time, the endpoint of wire segment $102_{n-1}$ has not yet been defined, because the centerline of its next segment $102_n$ has not yet been established. As shown in FIG. 10a, the cursor controlled by the pointing device of workstation 21 is at its current position CRS, which in the vicinity of wire segment $100_n$; but at this point in the process, target wire segment $100_n$ has not yet been selected or indicated as the target of a move-next-to command.

In FIG. 10b, the user has invoked the move-next-to command (process 92), for example by "dragging" the cursor position across target wire segment $100_n$, in this case from left to right between cursor position CRS to new cursor position CRS'; the held keystroke is then released with the cursor at new position CRS'. In this example, process 94 is performed by the cursor drag gesture indicating move-next-to. Wire segment $100_n$ is selected as the target wire segment for this command by the drag of the cursor across segment $100_n$. The target wire segment is on the same layer as the wire segment being drawn. In this example, target wire segment $102_n$ is to be placed along vertical wiring track $49V_{m+1}$ to the right of target wire segment $100_n$, which the user has indicated by the left-to-right direction of the cursor travel from position CRS to position CRS'. In situations in which the cursor is dragged across multiple parallel previously routed wire segments, it is contemplated that the target wire segment is the last wire segment crossed by that motion—in other words, the wire segment closest to final cursor position CRS' at which the invoking keystroke combination is released, in this example.

Referring back to FIG. 9, decision 95 is executed by system 20 to determine whether the "inherit" option was invoked in process 92. In this embodiment of the invention, this "inherit" option allows the user to indicate, with the command invoking the move-next-to operation, that the wire segment to be routed inherit the wire properties of the target wire segment next to which the segment being routed will be placed. This option may be indicated by a different keystroke combination pressed by the user, or alternatively by the setting of a flag or option via a pull-down menu or the like, or by pressing a modifier key (e.g., the "ctrl" key) during the mouse drag gesture. If the "inherit" option was invoked (decision 95 is "yes"), the wire properties (bit pitch, wire pitch, etc.) from the target wire segment are copied in process 96, for association with the wire segment currently being routed. If not (decision 95 is "no"), the wire segment being routed will adopt the default wire properties, in the usual manner.

In process 98, system 20 places the wire segment being routed at the first available user wiring track adjacent to the target wire segment, on the side indicated in process 94. FIG. 10c illustrates the result of process 98, in placing wire segment $102_n$ in wiring track $49V_{m+1}$, immediately adjacent to wire segment $100_n$ along wiring track $49V_m$. This defining of wiring track $49V_{m+1}$ also serves to "freeze" the length of previous wire segment $102_{n-1}$, and thus defines its endpoint EP102 as shown in FIG. 10c. The length of wire segment $102_n$ will not be defined until the placement of the next, orthogonal, wire segment $102_{n+1}$ for that conductor. As described above, if the "inherit" option was invoked, the properties of wire segment $102_n$ would correspond to those of wire segment $100_n$.

As evident from this description, the "move-next-to" command operates on a segment by segment basis, allowing some segments to be placed by way of "move-next-to" operations (with target wire segments from different buses, if desired), and other segments to be explicitly routed, all under user control. As such, following placement process 98, control returns to decision 73 described above relative to FIG. 4, to determine whether the wire containing wire segment $102_n$ is now to be terminated at a subchip 50, or if instead another segment is to be routed, in which case control will return back to decision 93 as described above.

According to this embodiment of the invention, therefore, additional buses and wires can be routed at close spacing to previously-routed buses and wires, with the layout displayed to the user at workstation 21 in a view of the entire bus, without requiring the user to zoom back and forth between wide angle and close views in order to effect that routing. It is therefore contemplated that this embodiment of the invention will greatly improve the efficiency and accuracy of conductor routing in modern integrated circuits.

The foregoing description refers to the use of the symbolic view of a representative wire (e.g., LSB) from bus 60 in the routing of that bus in the layout, for the case in which the bus corresponds to a logical bus communicating a multi-bit digital word (e.g., a five-bit wide data word for a signal named "sig_name"—sig_name[4], sig_name[3], sig_name[2], sig_ name[1], sig_name[0]). However, multiple signals other than multi-bit logical buses also often run between the same two subchips 50, including such multiple signals that are to be carried by conductors having similar properties (e.g., pitch). Examples of such signals include groups of data and control signals that run between the same subchips 50 as one another, multiple smaller logical buses of varying bit width, or simply several independent control signals having the same toplevel routing. Such multiple signals may be routable somewhat near one another in the layout of integrated circuit 45, spatially diverging from one another only upon reaching the subchip pins on either end of their conductors.

According to embodiments of this invention, system 20 can create a "synthetic" bus constructed from an arbitrarily or ad hoc assembled group of signals, to allow routing of those signals by way of a representative wire in the symbolic view, as described above for the case of logical buses. Such a synthetic bus is created by essentially assigning "bit positions" to the various signals in that synthetic bus, which allows the conductor for the "LSB" or "MSB" of the synthetic bus to be routed as described above relative to FIGS. 3, 6 and 9; the bit pitch, wire pitch, LSB/MSB, and directional properties then specify the routing of the other signals as described above, based on the routing of the representative wire.

In this embodiment of the invention, a synthetic bus is assigned a name that essentially constitutes an "alias" insofar as netlist 37 produced by synthesis process 14 is concerned; this synthetic bus is not added to netlist 37, nor does it create any additional gates or other elements in the overall layout. Rather, the alias of the synthetic bus merely becomes available for use by the layout engineer in routing multiple conductors as a group among subchips 50. For example, a fourteen-bit synthetic bus having the name (i.e., alias) "sigx" may be defined as including fourteen signal lines carrying signals that are not necessarily related to one another, by way of a "synthetic_bus" definitional command containing an ordered list:

synthetic_bus   sigx<13:0>={siga,   sigb,   sigc<9:0>, sigd<4:3>};

in which signals "siga" and "sigb" are single-bit signals, signal "sigc" is a ten-bit data word or control signal, and signal "sigd<4:3>" constitutes two bits out of a multi-bit data word or control signal. In this example, MSB sigx<13> carries the signal "siga", bit sigx<12> carries the signal "sigb", and so on, with LSB sigx<0> carrying bit 3 of signal "sigd". Of course, the format or ordering of signals in the command defining a synthetic bus can vary according to the implementation in system 20.

The defining of synthetic buses can also be used for logical buses, particularly in designs in which a hierarchy of signal names is used. In such a hierarchy, as known in the art, the lowest level signal name (i.e., at the gate level) may apply only at that low level, with the same signal being assigned different signal names at higher levels. It has been observed, in connection with this invention, that revision of a previously designed integrated circuit may involve the re-naming of signals (at the top level) automatically in synthesis process 14, or intentionally by human designers. Routing data for conductors among subchips 50 according to the toplevel name will thus be useless after the renaming of top level signals, requiring restarting of layout of these conductors and thus delay the release of the revision. According to this embodiment of the invention, however, a synthetic bus may be defined with reference to the lowest level signal names (which typically are not changed in synthesis) to a synthetic bus for which routing is generated; this enables previous toplevel routing data to be used merely by redefining the synthetic buses to use the new names.

It is contemplated that other uses and benefits of the synthetic bus assignment according to this embodiment of the invention will be apparent to those skilled in the art having reference to this specification.

Referring back to FIG. 3, the routing process continues until all buses are routed (decision 57 is "no"), following which routing is complete for the routable bus structures of integrated circuit 45. To the extent that other conductors remain to be routed for integrated circuit, conventional routing process 17 can then be completed for those conductors, by either an automated or a manual approach. Physical implementation (process 16 of FIG. 1a) can then be completed, leading to manufacture (process 18) of integrated circuit 45.

Figure 11:
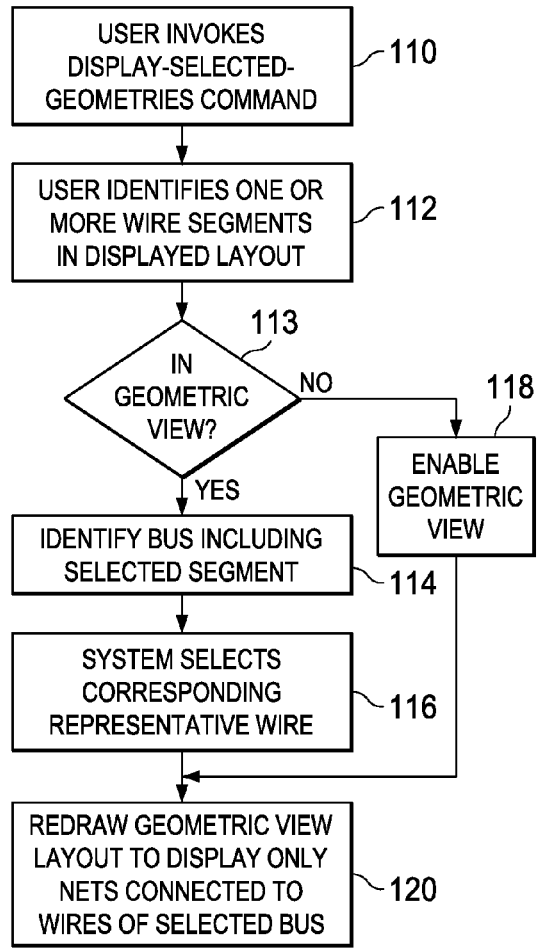
FIG. 11 is a flow diagram illustrating the operation of a "display-selected-geometries" command in the interactive routing of wires and buses in an integrated circuit, according to an embodiment of the invention.

According to another embodiment of the invention, as will now be described in FIG. 11, an optional feature of the routing editor system and method implemented via system 20 allows the design engineer to display only selected geometries following at least partial completion of the routing process. This selectable display feature may be invoked after routing is performed for all buses and wires in integrated circuit 45, or after the routing of some but not all of those buses and wires. In addition, this selectable display feature is especially useful during editing of the routing, such as during layout revisions. According to this embodiment of the invention, a "display-selected-geometries" command is provided by system 20, in which the user can easily display only those nets to which wires in a selected bus are connected, by identifying any segment of any wire in that bus. This selectable display allows the user to track the routed interconnections for that bus, for example to verify proper routing or to identify improvements to that routing, without the clutter of all other routed wires and buses in the integrated circuit. In addition, the ability to select a bus by simply "grabbing" a segment of any wire provides an efficient user interface for this operation.

The selectable display process according to this embodiment of the invention may be performed with the routing of buses and wires displayed at workstation 21 in either the symbolic view of the geometric view, as described above. In process 110 shown in FIG. 11, the user invokes a "display-selected-geometries" command at workstation 21, for example by effecting a particular keystroke or combination of keystrokes, by setting a flag in a pull-down menu, or the like. When invoked by a keystroke, repetition of that keystroke can toggle the "display-selected-geometries" off and on. With the command invoked, the user then identifies one or more wire segments in the displayed routing for which the selective display is to be performed, in process 112; for example, as described above in connection with the routing process, this selection may be made by the user executing a cursor movement to define a rectangle that is intersected by the desired one or more wire segments. It is contemplated that, in some implementations, multiple selections may be made by way of multiple separate rectangles being defined, for example by a control-click type of operation. Processes 110, 112 may alternatively be performed simultaneously, for example by the holding of a keystroke combination to invoke the command (process 110) during the click-and-drag selection of the desired wire segments (process 112). In addition or further in the alternative, processes 110, 112 may be performed in reverse order, by the user first selecting the desired geometries and then toggling the display-selected-geometries command.

The manner in which system 20 executes the display-selected-geometries command depends on whether the current display view at workstation 21 is the geometric view or the symbolic view. Decision 113 is executed by system 20 to determine whether the display is currently in the geometric view. If the display is in the symbolic view (decision 113 is "no"), then the wire segments selected in process 112 are segments of representative wires for corresponding buses 60. In this case, the geometric view is then enabled by system 20 in process 118. And in process 120, the displayed layout is redrawn at workstation 21 in the geometric view, but showing only those nets (identified in netlist 37) to which the wires of selected buses 60 are connected; because the display is in the geometric view at this point, all wires of all selected buses 60 are displayed in process 120. The user is then able to readily view the nets of interest, without the clutter of all other wires in the layout as would be present in the geometric view.

If decision 113 returns a "yes" result indicating that the display was already in the geometric view at the time of segment selection process 112, the geometries selected in process 112 do not necessarily identify the representative wire in the corresponding bus 60, but may instead be an arbitrarily selected segment in an arbitrarily selected wire. As such, in process 114, system 20 identifies bus 60 that includes this selected wire segment; this bus may be a logical bus or a synthetic bus, depending on the user assignment as described above. Once the bus is identified, system 20 identifies the representative wire of this selected bus 60, and forwards that selection to process 120 in which the displayed layout is redrawn at workstation 21 in the geometric view, to show only those nets to which the wires of selected buses 60 are connected.

This operation of processes 114, 116 to select identify bus 60 and then the representative wire in that bus is carried out, according to this embodiment of the invention, because of the manner in which the geometric view of that bus 60 is produced from the routing of its representative wire, and the application of the wire properties (i.e., bit pitch, wire pitch, MSB/LSB, and directional property), as described above in connection with process 53 (FIG. 3).

As a result of this embodiment of the invention, efficient display of only selected bus and wire interconnections to their corresponding nets in the layout of the integrated circuit is provided. Especially in modern complex integrated circuits with wide data paths (e.g., 128 bit data words), the display of all wires in all buses and the nets to which those wires connect can be sufficiently cluttered and dense that analysis of a specific bus requires zooming in and out over a wide range of magnification in order to follow those connections, which is not only tedious but can be error-prone. This embodiment of the invention thus greatly facilitates analysis and editing of routing by allowing the user to focus only on selected buses and wires.

Embodiments of this invention provide several important advantages in the design and layout of integrated circuits, particularly complex integrated circuits of the ASIC type, and involving many top-level interconnects among multiple subchips within the integrated circuit. As described above, this invention enables the human design engineer to manually route interconnections ("wires") in the layout of a very-large-scale integrated circuit in a highly efficient manner through the use of a representative wire to express a bus (of up to very wide bit width) in a symbolic view, without clutter in the display of the buses and wires, and without requiring routing of each and every wire in that bus. The symbolic view enabled by embodiments of this invention provides good visibility into the routing process, further facilitating the layout task. The use of bus properties to express the physical properties of wire segments within the routed bus further facilitates layout, and eliminates the tedium of specifying similar properties for each wire in each bus. The resulting routing file can be efficiently formatted and stored, and in a manner that allows the use of incremental change files to rapidly rebuild the routing upon starting of the routing editor, or following a system crash.

While this invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A computer-implemented method of defining the physical routing of interconnections in the layout of an integrated circuit, comprising the steps of:
    identifying a plurality of interconnections between nodes of first and second blocks in the integrated circuit layout as a first bus comprised of a plurality of wires;
    receiving drawing inputs from a user corresponding to physical routing of a representative wire in the first bus;
    displaying the physical routing of the representative wire at a graphics display of a computer system;
    storing, in a memory of the computer system, routing data comprising the location of each of one or more segments of the representative wire in the integrated circuit layout, and property data, for each segment, comprising a plurality of properties corresponding to the physical arrangement of the plurality of wires in the first bus;
    deriving routing data comprising the physical routing of one or more segments of each of a plurality of wires in the first bus in the integrated circuit layout, from the routing data and the associated property data of the representative wire; and
    then displaying, at the graphics display, the physical routing of the plurality of wires in the first bus.

2. The method of claim 1, wherein the segments of the representative wire comprise one or more straight wire segments in a first orientation, and one or more straight wire segments in a second orientation, the first and second orientations being orthogonal to one another.

3. The method of claim 2, wherein the routing data for the representative wire further comprises identification of a conductor level associated with each wire segment.

4. The method of claim 3, wherein the deriving step further comprises:
    receiving user inputs selecting the first and second conductor levels from among a plurality of available conductor levels;
    wherein the step of receiving drawing inputs comprises:
    for a second wire segment to extend in a second orientation from a first wire segment extending in a first orientation from a first node, the second orientation being orthogonal to the first orientation, receiving a pointing device select command identifying a centerline of the second wire segment;
    the method further comprising:
    responsive to the received pointing device select command, defining a first endpoint location at which the first wire segment ends;
    wherein the step of receiving drawing inputs further comprises:

for a next wire segment extending in an orthogonal orientation from a previous wire segment, receiving a pointing device select command identifying a centerline of the next wire segment;

and the method further comprising:

responsive to the received pointing device select command for the next wire segment, defining an endpoint location at which the previous wire segment ends.

5. The method of claim 4, further comprising:
after one of the steps of receiving a pointing device select command, receiving a user input selecting a third conductor level from among the plurality of conductor levels to be associated with at least one wire segment in one of the first and second orientations.

6. The method of claim 2, wherein the integrated circuit is arranged in a plurality of subchips placed in the integrated circuit, each subchip having input/output nodes;

and further comprising:
receiving a netlist specifying a plurality of interconnects, each interconnect identified as connecting an input/output node at a first subchip with an input/output node at a second subchip;
drawing an airline indicating a direct path routing for a representative one of the plurality of interconnects;
and wherein the step of receiving drawing inputs comprises:
receiving user inputs selecting an airline corresponding to the first bus.

7. The method of claim 1, wherein the plurality of properties comprise:
a wire pitch indicating a physical width of the first wire; and
a bit pitch indicating a spacing between adjacent wires in the bus.

8. The method of claim 7, wherein the bit pitch expresses the spacing between adjacent wires as a number of wiring tracks at the wire pitch.

9. The method of claim 7, wherein the plurality of properties further comprise:
for a first wire segment, a first expansion direction property indicating the direction, in a first direction, in which additional wires in the first bus are disposed relative to the representative wire; and
for a second wire segment, a second expansion direction property indicating the direction, in a second direction, in which additional wires in the first bus are disposed relative to the representative wire.

10. The method of claim 7, wherein the plurality of properties further comprise:
a bus position property indicating whether the representative wire is a least significant bit or a most significant bit of the first bus.

11. The method of claim 1, further comprising:
receiving user inputs specifying values of at least one of the plurality of properties corresponding to the physical arrangement of the plurality of wires in the bus.

12. The method of claim 1, wherein the plurality of interconnections identified as the first bus correspond to a logical bus for communicating a multi-bit data word.

13. The method of claim 1, wherein the step of identifying the first bus comprises:
receiving user inputs defining a synthetic bus comprising a plurality of a plurality of interconnections corresponding to unrelated signals communicated between the first and second blocks; and
identifying the first bus as the synthetic bus.

14. The method of claim 1, further comprising:
after the step of storing the routing data and property data for the first bus, identifying a plurality of interconnections between nodes of the first and second blocks in the integrated circuit layout as a second bus comprised of a plurality of wires;
receiving a user input invoking a move-next-to command;
receiving a user input selecting one of the wire segments of the first bus as a target wire segment and indicating a direction; and
defining routing data corresponding to the placement of a segment of a representative wire of the second bus in a wiring track adjacent to the target wire segment in the indicated direction.

15. The method of claim 14, wherein the user input invoking the move-next-to command indicates selection of an inherit option;
and further comprising:
defining property data for the placed segment of the representative wire of the second bus as the corresponding property data of the target wire segment.

16. The method of claim 1, further comprising:
repeating the identifying, receiving drawing inputs, displaying, storing, deriving, and displaying physical routing of a plurality of wires, for a plurality of buses;
receiving a user input invoking a display-selected-geometries command;
receiving a user input selecting one or more wire segments;
redrawing the physical routing of wires of the plurality of buses to display interconnections to wires in the bus including the selected wire segment, and to inhibit the display of wires in buses not including a selected wire segment.

17. The method of claim 16, wherein the user input invoking the display-selected-geometries command is received during the displaying of the physical routing of all wires of the plurality of buses;
the method further comprising:
identifying a bus including a selected wire segment; and
selecting the representative wire of the identified bus;
wherein the redrawing step comprises:
deriving the routing data of segments of the plurality of wires in the identified bus from the routing data and the associated property data of the representative wire of the identified bus; and
then displaying, at the graphics display, the physical routing of the plurality of wires in the identified bus and interconnections to those wires.

18. A computer system for interactively routing interconnections in a layout of an integrated circuit, comprising:
an input device for receiving inputs from a system user;
a graphics display;
a processor; and
memory resources, coupled to the processor, including program memory for storing a computer program including program instructions that, when executed by the processor, perform a plurality of operations comprising:
identifying a plurality of interconnections between nodes of first and second blocks in the integrated circuit layout as a first bus comprised of a plurality of wires;
receiving drawing inputs from the input device corresponding to physical routing of a representative wire in the first bus;
displaying the physical routing of the representative wire at the graphics display;

storing, in the memory resources, routing data comprising the location of each of one or more segments of the representative wire in the integrated circuit layout, and property data, for each segment, comprising a plurality of properties corresponding to the physical arrangement of the plurality of wires in the first bus;

deriving routing data comprising the physical routing of one or more segments of each of a plurality of wires in the first bus in the integrated circuit layout, from the routing data and the associated property data of the representative wire; and then displaying, at the graphics display, the physical routing of the plurality of wires in the first bus.

19. The system of claim 18, wherein the segments of the representative wire comprise one or more straight wire segments in a first orientation, and one or more straight wire segments in a second orientation, the first and second orientations being orthogonal to one another;

wherein the routing data for the representative wire further comprises identification of a conductor level associated with each wire segment;

wherein the operation of deriving routing data further comprises:

receiving inputs from the input device selecting the first and second conductor levels from among a plurality of available conductor levels;

wherein the operation of receiving drawing inputs comprises:

for a second wire segment to extend in a second orientation from a first wire segment extending in a first orientation from a first node, the second orientation being orthogonal to the first orientation, receiving a pointing device select command identifying a centerline of the second wire segment;

wherein the plurality of operations further comprises:

responsive to the received pointing device select command, defining a first endpoint location at which the first wire segment ends;

wherein the operation of receiving drawing inputs further comprises:

for a next wire segment extending in an orthogonal orientation from a previous wire segment, receiving a pointing device select command identifying a centerline of the next wire segment;

and wherein the plurality of operations further comprises:

responsive to the received pointing device select command for the next wire segment, defining an endpoint location at which the previous wire segment ends; and after one of the steps of receiving a pointing device select command, receiving a user input selecting a third conductor level from among the plurality of conductor levels to be associated with at least one wire segment in one of the first and second orientations.

20. The system of claim 18, wherein the plurality of properties comprise:

a wire pitch indicating a physical width of the first wire;

a bit pitch indicating a spacing between adjacent wires in the bus as a number of wiring tracks at the wire pitch;

for a first wire segment, a first expansion direction property indicating the direction, in a first direction, in which additional wires in the first bus are disposed relative to the representative wire;

for a second wire segment, a second expansion direction property indicating the direction, in a second direction, in which additional wires in the first bus are disposed relative to the representative wire; and a bus position property indicating whether the representative wire is a least significant bit or a most significant bit of the first bus.

21. The system of claim 18, wherein the operation of identifying the first bus comprises:

receiving inputs at the input device defining a synthetic bus comprising a plurality of a plurality of interconnections corresponding to unrelated signals communicated between the first and second blocks; and identifying the first bus as the synthetic bus.

22. The system of claim 18, wherein the plurality of operations further comprises:

after the operation of storing the routing data and property data for the first bus, identifying a plurality of interconnections between nodes of the first and second blocks in the integrated circuit layout as a second bus comprised of a plurality of wires;

receiving an input at the input device invoking a move-next-to command;

receiving an input at the input device selecting one of the wire segments of the first bus as a target wire segment and indicating a direction; and defining routing data corresponding to the placement of a segment of a representative wire of the second bus in a wiring track adjacent to the target wire segment in the indicated direction.

23. The system of claim 18, wherein the plurality of operations further comprises:

repeating the identifying, receiving drawing inputs, displaying, storing, deriving, and displaying physical routing of a plurality of wires, for a plurality of buses;

receiving an input at the input device invoking a display-selected-geometries command;

receiving an input at the input device selecting one or more wire segments;

redrawing the physical routing of wires of the plurality of buses to display interconnections to wires in the bus including the selected wire segment, and to inhibit the display of wires in buses not including a selected wire segment.

24. A non-transitory computer-readable medium storing a computer program that, when executed on a computer system, causes the computer system to perform a sequence of operations for interactively routing interconnections in a layout of an integrated circuit, the sequence of operations comprising:

identifying a plurality of interconnections between nodes of first and second blocks in the integrated circuit layout as a first bus comprised of a plurality of wires;

receiving drawing inputs from an input device corresponding to physical routing of a representative wire in the first bus;

displaying the physical routing of the representative wire at a graphics display;

storing, in the memory resources, routing data comprising the location of each of one or more segments of the representative wire in the integrated circuit layout, and property data, for each segment, comprising a plurality of properties corresponding to the physical arrangement of the plurality of wires in the first bus;

deriving routing data comprising the physical routing of one or more segments of each of a plurality of wires in the first bus in the integrated circuit layout, from the routing data and the associated property data of the representative wire; and then displaying, at the graphics display, the physical routing of the plurality of wires in the first bus.

25. The computer-readable medium of claim 24, wherein the segments of the representative wire comprise one or more straight wire segments in a first orientation, and one or more straight wire segments in a second orientation, the first and second orientations being orthogonal to one another;
- wherein the routing data for the representative wire further comprises identification of a conductor level associated with each wire segment;
- wherein the operation of deriving routing data further comprises:
  - receiving inputs from the input device selecting the first and second conductor levels from among a plurality of available conductor levels;
- wherein the operation of receiving drawing inputs comprises:
  - for a second wire segment to extend in a second orientation from a first wire segment extending in a first orientation from a first node, the second orientation being orthogonal to the first orientation, receiving a pointing device select command identifying a centerline of the second wire segment;
- wherein the plurality of operations further comprises:
  - responsive to the received pointing device select command, defining a first endpoint location at which the first wire segment ends;
- wherein the operation of receiving drawing inputs further comprises:
  - for a next wire segment extending in an orthogonal orientation from a previous wire segment, receiving a pointing device select command identifying a centerline of the next wire segment;
- and wherein the plurality of operations further comprises:
  - responsive to the received pointing device select command for the next wire segment, defining an endpoint location at which the previous wire segment ends; and
  - after one of the steps of receiving a pointing device select command, receiving a user input selecting a third conductor level from among the plurality of conductor levels to be associated with at least one wire segment in one of the first and second orientations.

26. The computer-readable medium of claim 24, wherein the plurality of properties comprises:
- a wire pitch indicating a physical width of the first wire;
- a bit pitch indicating a spacing between adjacent wires in the bus as a number of wiring tracks at the wire pitch;
- for a first wire segment, a first expansion direction property indicating the direction, in a first direction, in which additional wires in the first bus are disposed relative to the representative wire;
- for a second wire segment, a second expansion direction property indicating the direction, in a second direction, in which additional wires in the first bus are disposed relative to the representative wire; and
- a bus position property indicating whether the representative wire is a least significant bit or a most significant bit of the first bus.

27. The computer-readable medium of claim 24, wherein the operation of identifying the first bus comprises:
- receiving inputs at the input device defining a synthetic bus comprising a plurality of a plurality of interconnections corresponding to unrelated signals communicated between the first and second blocks; and
- identifying the first bus as the synthetic bus.

28. The computer-readable medium of claim 24, wherein the plurality of operations further comprises:
- after the operation of storing the routing data and property data for the first bus, identifying a plurality of interconnections between nodes of the first and second blocks in the integrated circuit layout as a second bus comprised of a plurality of wires;
- receiving an input at the input device invoking a move-next-to command;
- receiving an input at the input device selecting one of the wire segments of the first bus as a target wire segment and indicating a direction; and
- defining routing data corresponding to the placement of a segment of a representative wire of the second bus in a wiring track adjacent to the target wire segment in the indicated direction.

29. The computer-readable medium of claim 24, wherein the plurality of operations further comprises:
- repeating the identifying, receiving drawing inputs, displaying, storing, deriving, and displaying physical routing of a plurality of wires, for a plurality of buses;
- receiving an input at the input device invoking a display-selected-geometries command;
- receiving an input at the input device selecting one or more wire segments;
- redrawing the physical routing of wires of the plurality of buses to display interconnections to wires in the bus including the selected wire segment, and to inhibit the display of wires in buses not including a selected wire segment.

* * * * *